United States Patent
Snider

(10) Patent No.: US 7,257,016 B2
(45) Date of Patent: Aug. 14, 2007

(54) ENHANCED NANOWIRE-CROSSBAR LATCH ARRAY

(75) Inventor: Gregory S. Snider, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 129 days.

(21) Appl. No.: 11/136,950

(22) Filed: May 24, 2005

(65) Prior Publication Data

US 2006/0268598 A1 Nov. 30, 2006

(51) Int. Cl.
*G11C 11/00* (2006.01)
(52) U.S. Cl. ............ 365/151; 365/189.05; 365/230.08; 977/762
(58) Field of Classification Search ................ 365/151, 365/189.05, 230.08; 977/762
See application file for complete search history.

(56) References Cited

U.S. PATENT DOCUMENTS

| 6,586,965 B2 | 7/2003 | Kuekes |
| 6,870,394 B2 * | 3/2005 | Kuekes ......................... 326/41 |
| 6,944,054 B2 * | 9/2005 | Rueckes et al. ............ 365/177 |
| 7,113,426 B2 * | 9/2006 | Rueckes et al. ....... 365/185.01 |

* cited by examiner

*Primary Examiner*—Anh Phung
*Assistant Examiner*—N Nguyen

(57) ABSTRACT

Various embodiments of the present invention are directed to a signal-storing nanowire-crossbar latch array. In one embodiment, the signal-storing nanowire-crossbar latch array is fabricated from three signal lines, including an enable line and two control lines, that cross and intersect with a number of signal wires. Signals are stored in the nanowire-crossbar latch array, and output from the nanowire-crossbar latch array, by applying an input signal to each signal wire and applying selected voltages and voltage pulses to the control lines. In alternate embodiments, a second enable line that crosses and interconnects with each signal wire is added to the nanowire-crossbar latch array.

12 Claims, 22 Drawing Sheets

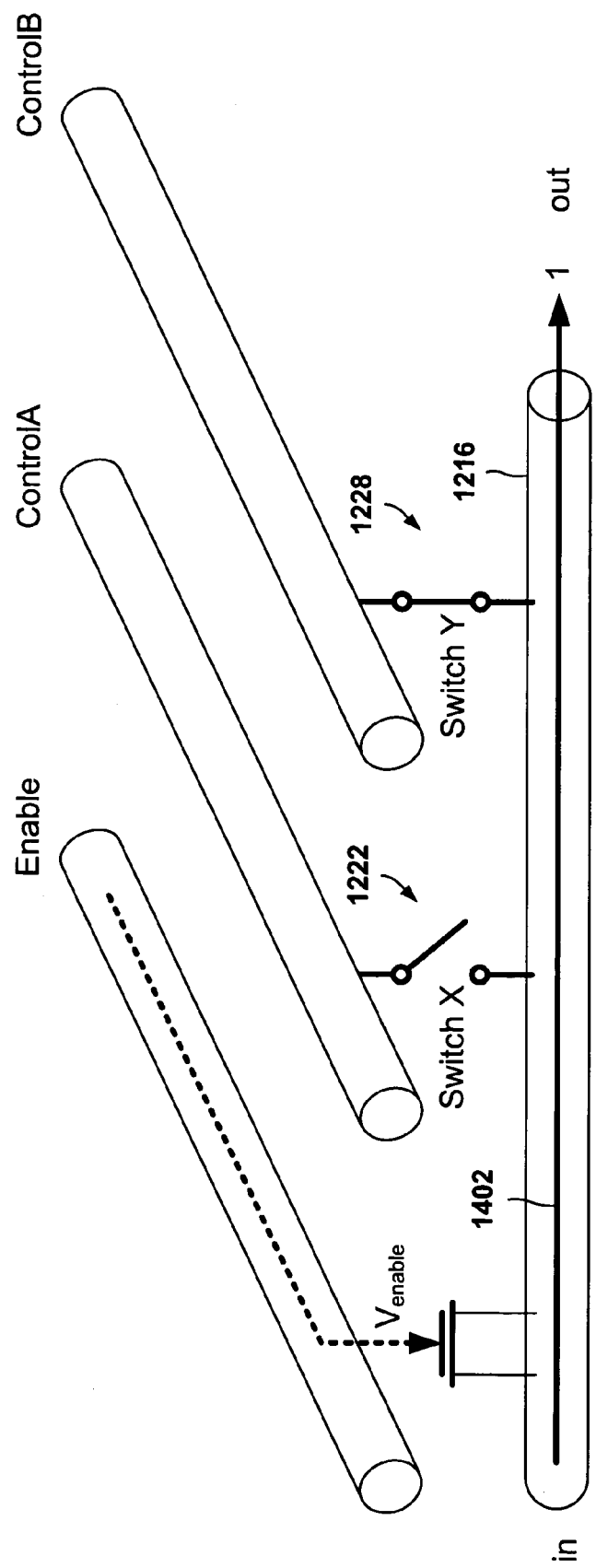

ENHANCED NANOWIRE-CROSSBAR LATCH ARRAY

TECHNICAL FIELD

The present invention relates to electronic devices, and, in particular, to the fabrication of nanoscale electronic latch arrays configured from nanowire crossbars.

BACKGROUND OF THE INVENTION

During the past fifty years, the electronics and computing industries have been relentlessly propelled forward by ever decreasing sizes of basic electronic components, such as transistors and signal lines, and by correspondingly ever increasing component densities of integrated circuits, including processors and electronic memory chips. Eventually, however, it is expected that fundamental component-size limits will be reached in semiconductor-circuit-fabrication technologies based on photolithographic methods. As the size of components decreases below the resolution limit of ultraviolet light, for example, far more technically demanding and expensive higher-energy-radiation-based technologies need to be employed to create smaller components using photolithographic techniques. Expensive semiconductor fabrication facilities may need to be rebuilt in order to use the new techniques. Many new obstacles are also expected to be encountered. For example, it is necessary to fabricate semiconductor devices through a series of photolithographic steps, with precise alignment of the masks used in each step with respect to the components already fabricated on the surface of a nascent semiconductor. As the component sizes decrease, precise alignment becomes more and more difficult and expensive. As another example, the probabilities that certain types of randomly distributed defects in semiconductor surfaces result in defective semiconductor devices may increase as the sizes of components manufactured on the semiconductor surfaces decrease, resulting in an increasing proportion of defective devices during manufacture, and a correspondingly lower yield of useful product. Ultimately, various quantum effects that arise only at molecular-scale distances may altogether overwhelm current approaches to component fabrication in semiconductors.

In view of these problems, researchers and developers have expended considerable research effort in fabricating sub-microscale and nanoscale electronic devices using alternative technologies. Nanoscale electronic devices generally employ nanoscale signal lines having widths, and nanoscale components having dimensions, of less than 100 nanometers. More densely fabricated nanoscale electronic devices may employ nanoscale signal lines having widths, and nanoscale components having dimensions, of less than 50 nanometers, and, in certain types of devices, less than 10 nanometers.

Although general nanowire technologies have been developed, it is not necessarily straightforward to employ nanowire technologies to miniaturize existing types of circuits and structures. While it may be possible to tediously construct miniaturized, nanowire circuits similar to the much larger, current circuits, it is impractical, and often impossible, to manufacture such miniaturized circuits using current technologies. Even were such straightforwardly miniaturized circuits able to be feasibly manufactured, the much higher component densities that ensue from combining together nanoscale components necessitate much different strategies related to removing waste heat produced by the circuits. In addition, the electronic properties of substances may change dramatically at nanoscale dimensions, so that different types of approaches and substances may need to be employed for fabricating even relatively simple, well-known circuits and subsystems at nanoscale dimensions. Thus, new implementation strategies and techniques need to be employed to develop and manufacture useful circuits and structures at nanoscale dimensions using nanowires.

Digital electronic systems, such as state machines, are generally described as collections of logic functions and memory functions. State machines commonly store values of logical variables into a memory and subsequently reuse stored logical variable values as inputs for logic functions. Latches are commonly employed for storing logical variable values. Although microscale latches are well-known in the art of general computing, nanoscale latches compatible with nanoscale logic arrays are only recently available, and the design and manufacture of nanoscale latches present numerous challenges. Therefore, designers, manufacturers, and users of nanoscale logic devices have recognized the need for nanoscale latches and methods for producing nanoscale latches compatible with nanoscale logic.

SUMMARY OF THE INVENTION

Various embodiments of the present invention are directed to a signal-storing nanowire-crossbar latch array. In one embodiment, the signal-storing nanowire-crossbar latch array is fabricated from three signal lines, including an enable line and two control lines, that cross and intersect with a number of signal wires. Signals are stored in the nanowire-crossbar latch array, and output from the nanowire-crossbar latch array, by applying an input signal to each signal wire and applying selected voltages and voltage pulses to the control lines. In alternate embodiments, a second enable line that crosses and interconnects with each signal wire is added to the nanowire-crossbar latch array.

BRIEF DESCRIPTION OF THE DRAWINGS

FIGS. 14A-14B illustrate two possible switch positions following the exemplary pulse sequence shown in FIGS. 12A-13B, for the exemplary nanowire-crossbar latch shown in FIG. 10.

DETAILED DESCRIPTION OF THE INVENTION

Various embodiments of the present invention are directed to designing nanowire-crossbar latch arrays. The present invention is described below in the following three subsections: (1) an overview of nanowire crossbars, (2) an overview of nanowire-crossbar latches, and (3) nanowire-crossbar-latch-array embodiments of the present invention.

Overview of Nanowire Crossbars

Figure 1:
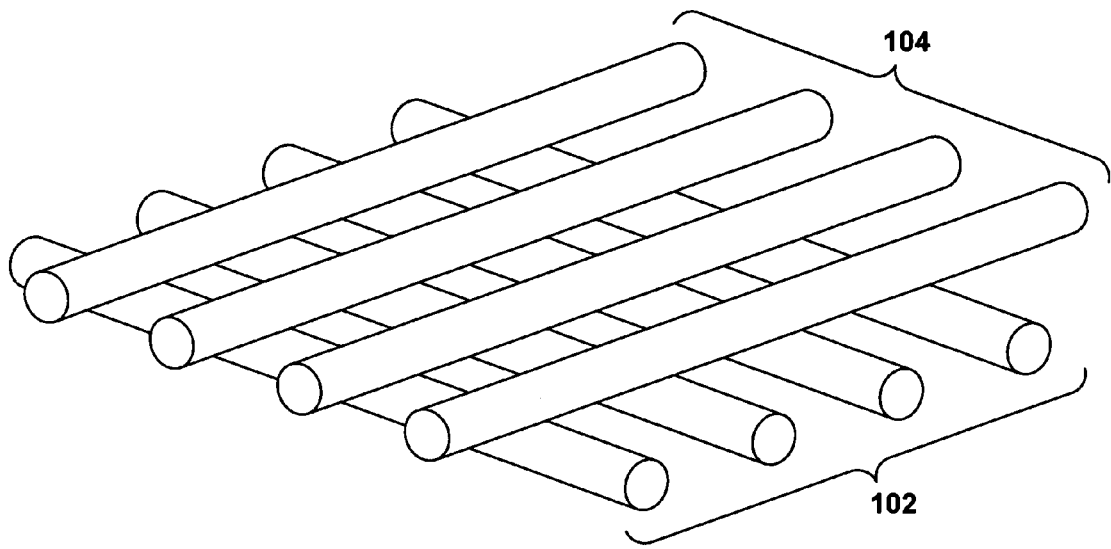
FIG. 1 illustrates an exemplary nanowire crossbar.

A relatively new and promising technology for manufacturing electronic devices involves nanowire crossbars. FIG. 1 illustrates an exemplary nanowire crossbar. In FIG. 1, a first layer of approximately parallel nanowires 102 is overlain by a second layer of approximately parallel nanowires 104 roughly perpendicular, in orientation, to the nanowires of the first layer 102, although the orientation angle between the layers may vary. The two layers of nanowires form a lattice, or crossbar, each nanowire of the second layer 104 overlying all of the nanowires of the first layer 102 and coming into close contact with each nanowire of the first layer 102, at intersections that represent the closest contact between two nanowires. Note that the term "nanowire crossbar" may refer to crossbars having one or more layers of sub-microscale, microscale, or larger wires in addition to nanowires.

Nanowires can be fabricated using mechanical nanoprinting techniques. Alternatively, nanowires can be chemically synthesized and can be deposited as layers of nanowires in one or a few process steps. Other alternative techniques for fabricating nanowires may also be employed. Thus, a two-layer nanowire crossbar comprising first and second layers, as shown in FIG. 1, can be manufactured by any of numerous relatively straightforward processes. Many different types of conductive and semi-conductive nanowires can be chemically synthesized from metallic and semiconductor substances, from combinations of these types of substances, and from other types of substances. A nanowire crossbar may be connected to microscale signal-line leads or other electronic leads through a variety of different methods to incorporate the nanowires into electrical circuits.

Figure 2:
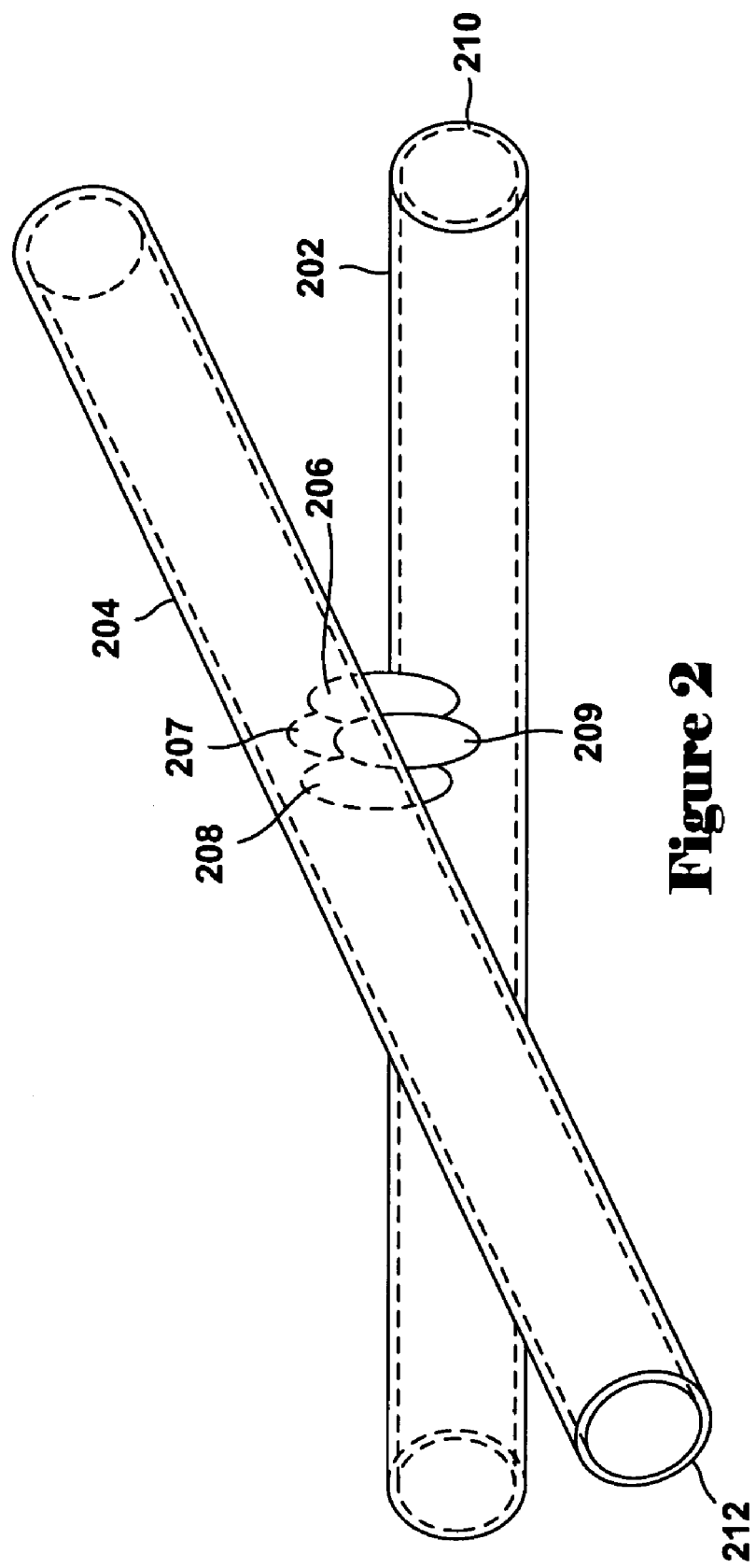
FIG. 2 illustrates a nanowire junction at an intersection between two roughly orthogonal nanowires.

Nanowire crossbars may be used to create arrays of nanoscale electronic components, such as transistors, diodes, resistors, and other familiar basic electronic components. FIG. 2 illustrates a nanowire junction at an intersection between two roughly orthogonal nanowires. In FIG. 2, the nanowire junction interconnects nanowires 202 and 204 of two contiguous layers within a nanowire crossbar. Note that the nanowire junction may or may not involve physical contact between the two nanowires 202 and 204. As shown in FIG. 2, the two nanowires are not in physical contact at their overlap point, but the gap between them is spanned by a small number of molecules 206-209. Various different types of molecules may be introduced at nanowire junctions for a variety of different purposes. In many cases, the molecules of a nanowire junction may be accessed, for various purposes, through different voltage levels or current levels placed on the nanowires forming the nanowire junction. The molecules spanning the nanowire junction in FIG. 2 may have various different quantum states in which the molecules exhibit resistive, semiconductor-like, or conductive electrical properties. The current passing between the two nanowires interconnected by a nanowire junction may be a nonlinear function of the voltage across the nanowire junction as a result of quantum-mechanical tunneling of electrons through relatively low-energy, unoccupied quantum states of the molecules. The quantum states, and relative energies of quantum states, of the molecules may be controlled by applying differential currents or voltages to the nanowires forming the interaction. For example, molecules may be conductive in a reduced state, but may act as insulators in an oxidized state, with redox reactions controlled by voltage levels determining which of the quantum states the molecules inhabit.

In general, a nanowire junction is anisotropic, having a polarity or direction with respect to physical properties, including electrical properties. This anisotropy may arise from different chemical and/or physical properties of nanowires in the two layers of a nanowire crossbar, may arise from asymmetries of nanowire-junction molecules, and uniform orientation of the nanowire-junction molecule with respect to the nanowire layers, and may arise both from differences in the properties of the nanowires as well as nanowire-junction-molecule asymmetries. The fact that nanowire junctions may have polarities allows for controlling nanowire junction properties by applying positive and negative voltages to nanowire junctions, eliciting forward and reverse currents within the nanowire junctions.

As shown in FIG. 2, the nanowires may include outer coatings, such as outer coatings 210 and 212. The outer coatings may serve to insulate nanowires from one another, may constitute the molecules that serve to span nanowire junctions when the nanowires are placed in contact with one another, and/or may serve as modulation-dopant-layers, which can be selectively activated to dope semiconductor nanowires. Both p-type and n-type modulation dopant coatings have been developed. In other applications, the molecules spanning nanowire junctions between overlapping nanowires may be introduced as a separate layer formed between layers of nanowires. In some cases, the state changes of nanowire-junction molecules may not be reversible. For example, the nanowire-junction molecules may initially be resistive, and may be made conductive through application of relatively high voltages. In other cases, the nanowire-junction molecules may be conductive, but the molecules may be irreversibly damaged, along with portions of the nanowires proximal to the nanowire junctions, through application of very high voltage levels, resulting in disrupting conductivity between the two nanowires and breaking electrical connection between them. In yet other cases, the nanowire-junction molecules may transition reversibly from one state to another and back, so that the nanoscale electrical components configured at nanowire junctions may be reconfigured, or programmed, by application of differential voltages to selected nanowire junctions.

One type of nanowire junction that can be configured behaves as if it were a resistor in series with a switch that may be opened or closed. When the switch is closed, the nanowire-junction molecule connects the overlapping nanowires at the nanowire junction. When the switch is open, the nanowire junction molecule spanning the nanowire junction has no effect on the current.

Figure 3A:
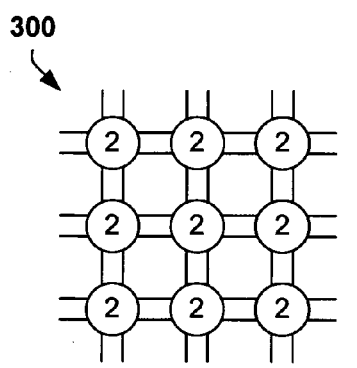
FIGS. 3A-3D illustrate one possible approach for configuring a network of nanoscale electrical components from a two-layer nanowire crossbar.
Figure 3B:
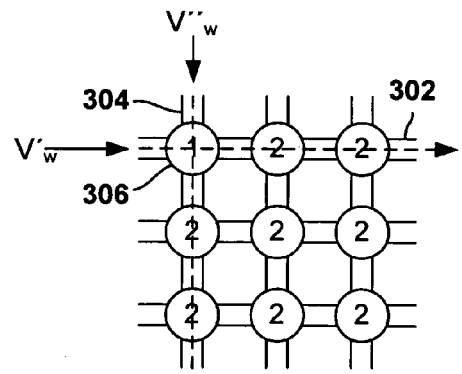
Figure 3C:
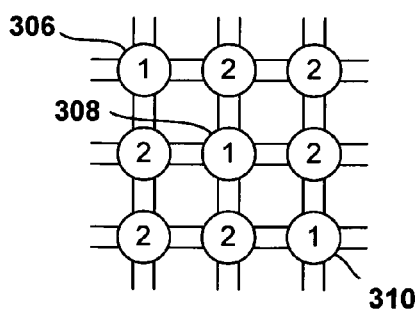
Figure 3D:
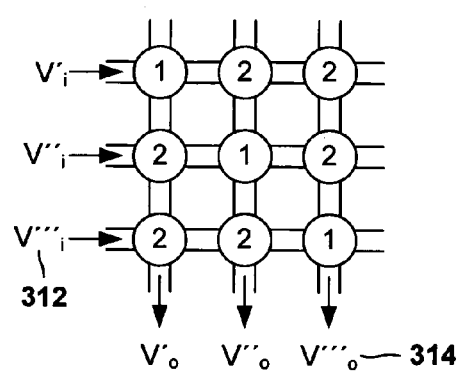

Nanowire junctions can be configured electrically, optically, mechanically or by other means. FIG. 3 illustrates one possible approach to configuring a network of reconfigurable nanoscale electrical components from a two-layer nanowire crossbar. In FIGS. 3A-3D, a small 3×3 nanowire crossbar is shown, with circles at all nine nanowire junctions that indicate the state of the nanowire-junction molecules. In one state, labeled "1" in FIGS. 3A-3D, the nanowire-junction molecules may have certain semiconductor, or conductive properties, while in a second state, labeled "2" in FIGS. 3A-3D, nanowire-junction molecules may have different properties. Initially, as shown in FIG. 3A, the states of the nanowire junctions of the nanowire crossbar 300 are in the state labeled "2." Next, as shown in FIG. 3B, each nanowire junction may be uniquely accessed by applying a WRITE voltage, or configuring voltage, to the nanowires that form the nanowire junction in order to configure, or program, the nanowire junction to have the state "1." For example, in FIG. 3B, a first WRITE voltage $v_w'$ is applied to horizontal nanowire 302 and a second WRITE voltage $v_w''$ is applied to vertical nanowire 304 to change the state of the nanowire junction 306 from "2" to "1." Individual nanowire junctions may be configured through steps similar to the steps shown in FIG. 3B, resulting finally in a fully configured nanoscale component network as shown in FIG. 3C. Note that, in FIG. 3C, the states of nanowire junctions 306, 308, and 310, forming a downward-slanted diagonal through the nanowire crossbar, have been configured by selective application of WRITE voltages. Finally, as shown in FIG. 3D, the nanoscale electrical component network can be used as a portion of an integrated circuit. Input voltages $v_i'$, $v_i''$, and $v_i'''$ may be applied to the nanoscale electrical component lattice at inputs 312 and output voltages $v_o'$, $v_o''$, and $v_o'''$ 314 may be accessed as the result of operation of the nanoscale electrical component network that represents a portion of an integrated circuit. In general, the input and output voltages $v_i'$, $v_i''$, and $v_i'''$ and $v_o'$, $v_o''$, and $v_o'''$ have relatively low magnitudes compared with the WRITE voltages $v_w$. Depending on the types of nanowires, types of dopants employed in the case of semiconductor nanowires, and the types of nanowire-junction molecules employed in the nanowire crossbar, many different, but similar configuring processes may be used to configure nanowire crossbars into nanowire-based electrical components networks. The example of FIG. 3 is meant to illustrate a general process by which nanowire crossbars may be configured as useful portions of electronic circuits.

Figure 4A:
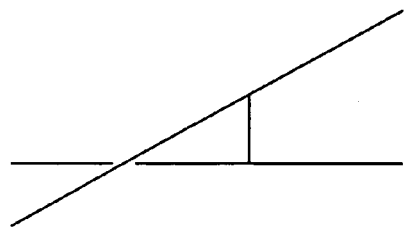
FIGS. 4A-4F schematically illustrate a number of simple electrical components that can be programmed using configurable nanowire junctions within a nanowire crossbar.
Figure 4B:
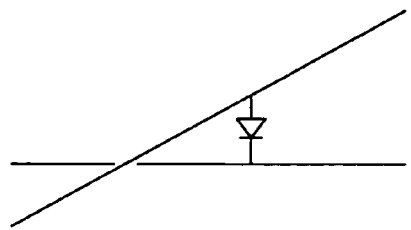
Figure 4C:
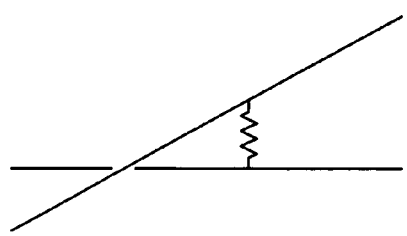
Figure 4D:
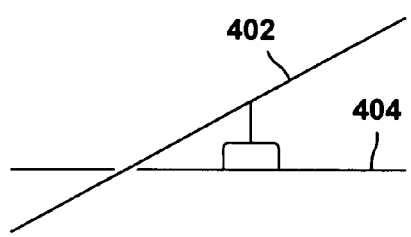
Figure 4E:
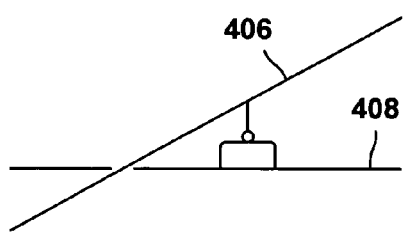
Figure 4F:
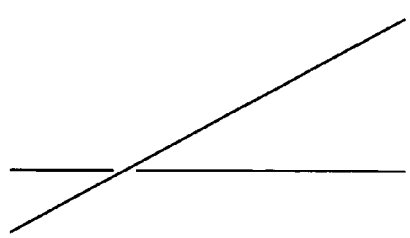

Nanowire junctions in nanowire crossbars may be configured, in various techniques depending on the chemical nature of the nanowires and nanowire-junction-spanning molecules, to form a wide variety of different, simple electronic components. FIG. 4 schematically illustrates a number of simple electrical components that can be programmed using configurable nanowire junctions with a nanowire crossbar. A nanowire junction may operate as (1) a simple conductive connection between two nanowires, as shown in FIG. 4A; (2) a diode that conducts current in only one direction between two nanowires, as shown in FIG. 4B; (3) a resistor, with the magnitude of resistance configurable by application of different configuring voltages, as shown in FIG. 4C; (4) a negatively doped field-effect transistor ("nFET"), as shown in FIG. 4D; (5) a positively doped field-effect transistor ("pFET"), as shown in FIG. 4E; and (6) the overlapping of two conductive nanowires, with the voltage and current associated with each nanowire completely independent from one another, as shown in FIG. 4F.

The nFET and pFET nanowire junctions perform switch operations, controlled by the signal level placed on gate wires, that can either enable or disable source/drain wires. An enabled source/drain wire allows current to flow beyond the nFET or pFET nanowire junction, while current does not flow beyond the nFET or pFET nanowire junction when the source/drain wire is disabled. However, nFETs and pFETs exhibit opposite behavior based on the signal level applied to the gate wires. In the case of the nFET, shown in FIG. 4D, a relatively low signal on the gate nanowire 402 causes the nFET to disable source/drain nanowire 404, while a relatively high signal on gate nanowire 402 causes the nFET to enable source/drain nanowire 404. By contrast, in the case of the pFET shown in FIG. 4E, a relatively low signal on gate nanowire 406 causes the pFET to enable source/drain nanowire 408, and a relatively high signal on gate nanowire 406 causes the pFET to disable source/drain nanowire 408. Note that a nanowire junction may also be configured as a high resistance nanowire junction, essentially interrupting conduction at the nanowire junction with respect to both overlapping nanowires.

Thus, as discussed above with reference to FIGS. 1-4, a two-dimensional nanowire crossbar may be fabricated and then configured as a network of electrical components. Note also that a nanowire junction, although shown in FIGS. 4A-4F to comprise the nanowire junction of two single nanowires, may also comprise a number of nanowire junctions between a number of nanowires in a first layer of a nanowire crossbar that together comprise a single conductive element and the nanowires in a second nanowire layer that together comprise a second conductive element.

The configurable electrical resistances of nanowire junctions are important and special properties of certain types of nanowire junctions. When certain types of molecules are used for nanowire junctions, the initially relatively high resistances of the nanowire junctions may be lowered by applying relatively large positive voltages to the nanowire junctions. The resistances of the nanowire junctions may be a function of the magnitudes of the highest voltages applied to the nanowire junction. By applying higher and higher positive voltages to a nanowire junction, the resistance of the nanowire junction may be made lower and lower. A relatively low resistivity state achieved by application of a positive voltage may be reversed by applying a sufficiently high, negative voltage. Thus, not only is the electrical resistance of a nanowire junction configurable, the electrical resistance may also be reconfigurable, depending on the type of molecules forming the nanowire junction.

Note that the term "signal" refers to a detectable low or high physical quantity, such as voltage and current, that can be input, output, and transmitted through nanowire crossbars. The terms "low" and "high" generally refer to ranges of values. For example, a signal that ranges between no signal and a signal threshold may be called a "low signal," and any signal above the signal threshold is called a "high signal." A low signal is represented by the bit value "0," and a high signal is represented by the bit value "1."

An Overview of Nanowire-Crossbar Latches

Figure 5A:
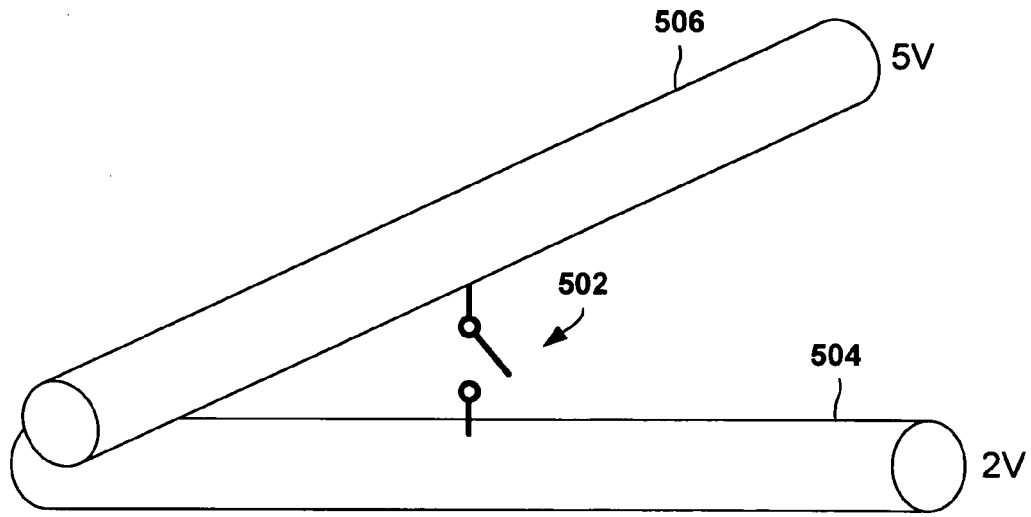
FIGS. 5A-5B illustrate two exemplary voltage drops across a switch constructed at a nanowire junction between two overlapping nanowires.
Figure 5B:
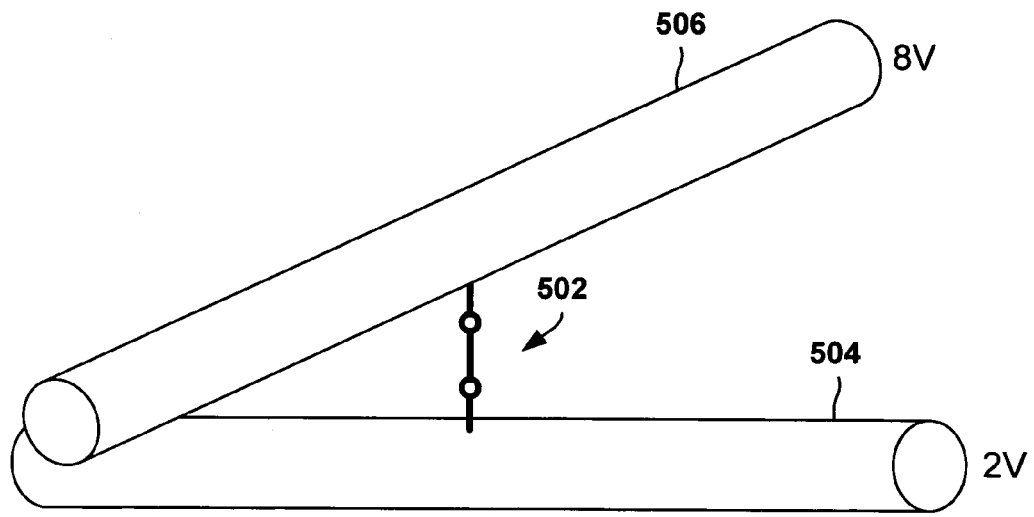

As discussed in the previous subsection, various electrical components can be formed at nanowire junctions. One possible electrical component formed at a nanowire junction is a switch. FIGS. 5A-5B illustrate two exemplary voltage drops across a switch constructed at a nanowire junction between two overlapping nanowires. In FIGS. 5A-5B, and in subsequent figures, the switch is represented as a mechanical switch, for clarity of illustration, but the switch is actually implemented in molecules with different resistances or other physical states. FIG. 5A shows switch 502 formed at a nanowire junction connecting nanowire 504 with nanowire 506. A voltage of 2V is applied to nanowire 504 and a voltage of 5V is applied to nanowire 506. The potential difference, or voltage drop, across switch 502 is 3V. In FIG. 5A, switch 502 is shown in an open position. When a voltage drop across switch 502 is equal to or exceeds a close-voltage threshold value for a sufficient amount of time, switch 502 transitions to a closed position. For example, assume that switch 502 has a close-voltage threshold of 5V. In FIG. 5A, the voltage drop across switch 502 is less than 5V and switch 502 remains in an open position. Switch 502 also remains open if the voltage drop is 0 or a negative value. However, in FIG. 5B, if a voltage of 8V is applied to nanowire 506, then the voltage drop across switch 502 is greater than 5V, and switch 502 therefore transitions to a closed position. Similarly, switches have open-voltage thresholds that control when switches transition from a closed position to an open position.

Figure 6A:
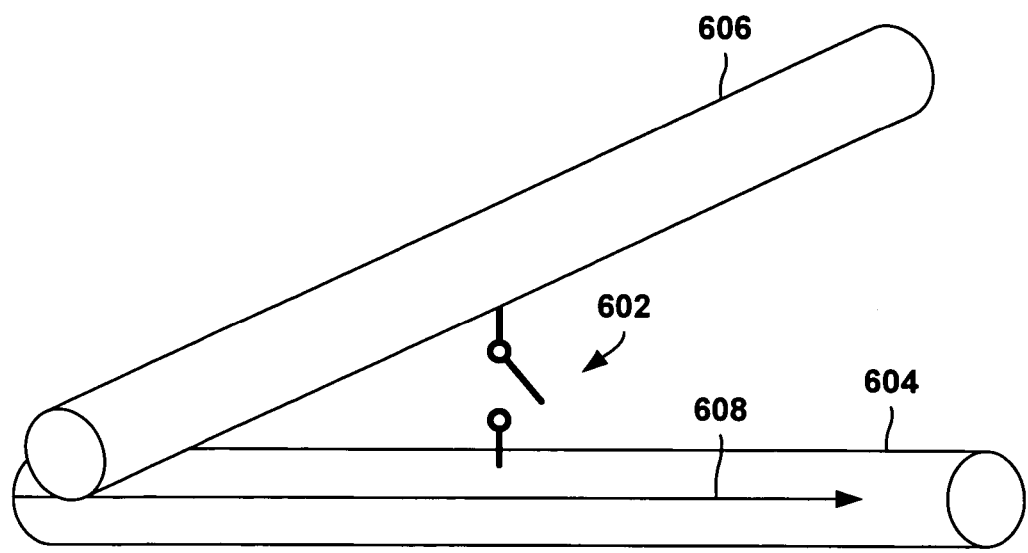
FIGS. 6A-6B illustrate the operation of an exemplary switch constructed at a nanowire junction between two overlapping nanowires.
Figure 6B:
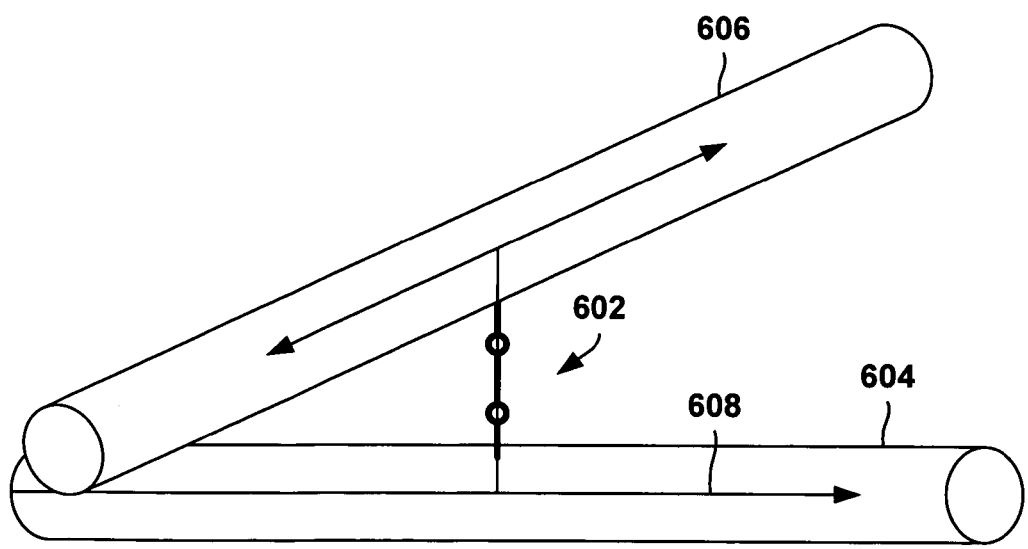

FIGS. 6A-6B illustrate the operation of an exemplary switch constructed at a nanowire junction between two overlapping nanowires. In FIG. 6A, switch 602 is formed at a nanowire junction connecting nanowire 604 to nanowire 606. Switch 602 is shown in an open position. Current signal 608 flows along nanowire 604 unaffected by switch 602. However, as shown in FIG. 6B, when switch 602 is in a closed position, current signal 608 can branch at switch 602 and flow along both nanowires 604 and 606.

Figure 7A:
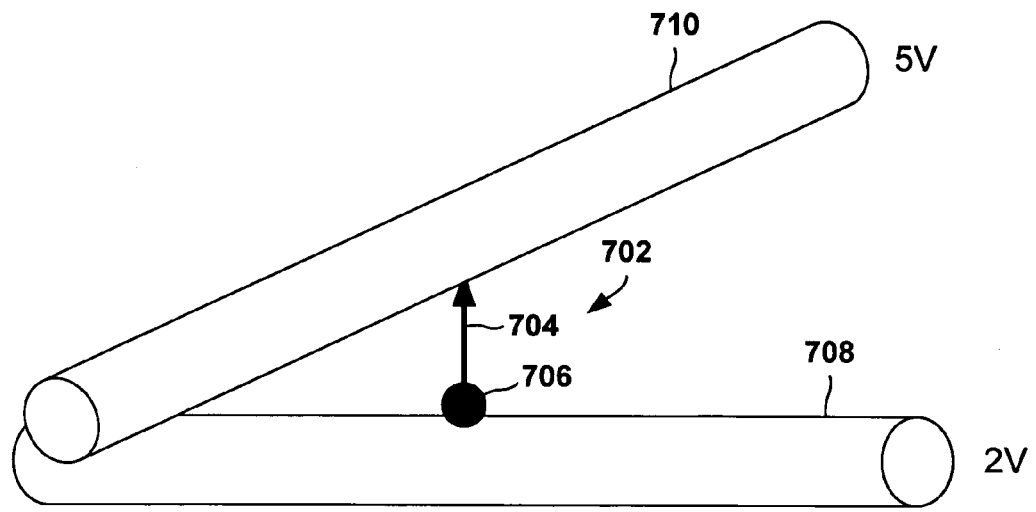
FIGS. 7A-7B illustrates two exemplary voltage drops across an asymmetric switch constructed at a nanowire junction between two overlapping nanowires.
Figure 7B:
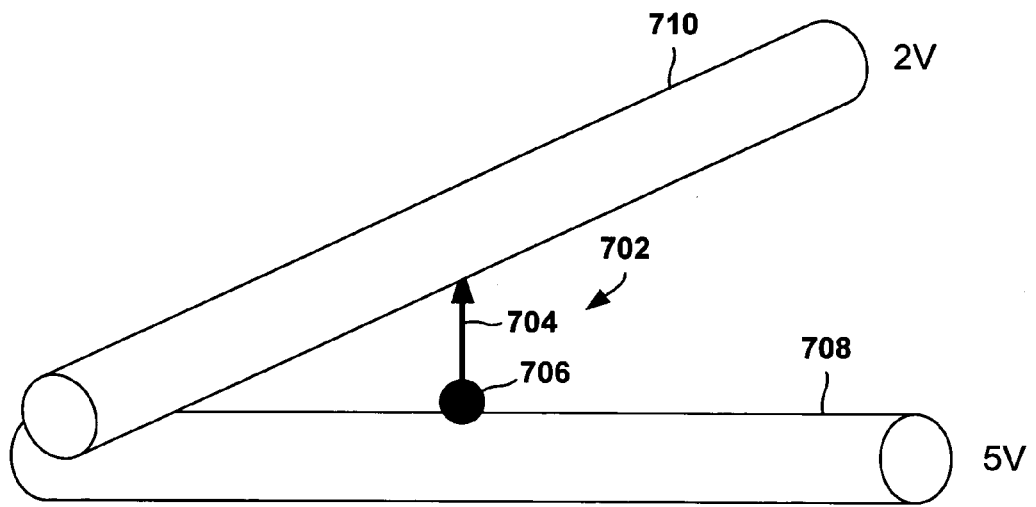

FIGS. 7A-7B illustrate two exemplary voltage drops across an asymmetric switch constructed at a nanowire junction between two overlapping nanowires. FIG. 7A shows an asymmetric switch connecting two nanowires. Asymmetric switch 702 is represented by arrow 704 extending from circle 706 on nanowire 708 to nanowire 710, indicating a particular polarity of the asymmetric switch. A voltage of 2V is applied to nanowire 708 and a voltage of 5V is applied to nanowire 710 thereby creating a voltage drop across asymmetric switch 702. A voltage drop may be positive or negative, depending on which of the two nanowires is considered to be at a reference voltage. In the case of asymmetric switches, the nanowire on which the circle, such as circle 706 in the representation of the asymmetric switch shown in FIG. 7A, rests is considered to be the reference nanowire. Since nanowire 710 is at a higher voltage than nanowire 708, a positive voltage drop occurs across the asymmetric switch. FIG. 7B shows a negative voltage drop across asymmetric switch 702.

Asymmetric switches formed along nanowire junctions open and close at certain voltage-drop thresholds. Application of selected voltages across each nanowire connected by an asymmetric switch can create a voltage drop that equals or exceeds a threshold voltage value. When a voltage drop equals or exceeds an open-voltage-drop-threshold value, an asymmetric switch can transition from a closed position to an open position. When a voltage drop equals or exceeds a close-voltage-drop-threshold value, an asymmetric switch can transition from an open position to a closed position. Hence, the asymmetric operation of an asymmetric switch provides discrete voltage-drop thresholds for controlling switch position: (1) a positive-voltage-drop threshold that controls when an asymmetric switch opens; and (2) a negative-voltage-drop threshold that controls when an asymmetric switch closes. For instance, a positive voltage drop across an asymmetric switch exceeding a positive-voltage-drop threshold can cause an asymmetric switch to assume an open position. Conversely, a negative voltage drop exceeding a negative voltage-drop threshold across an asymmetric switch can cause an asymmetric switch to assume a closed position. In alternate asymmetric switches, a positive voltage drop may close the switch, while a negative voltage drop may open the switch.

Figure 8:
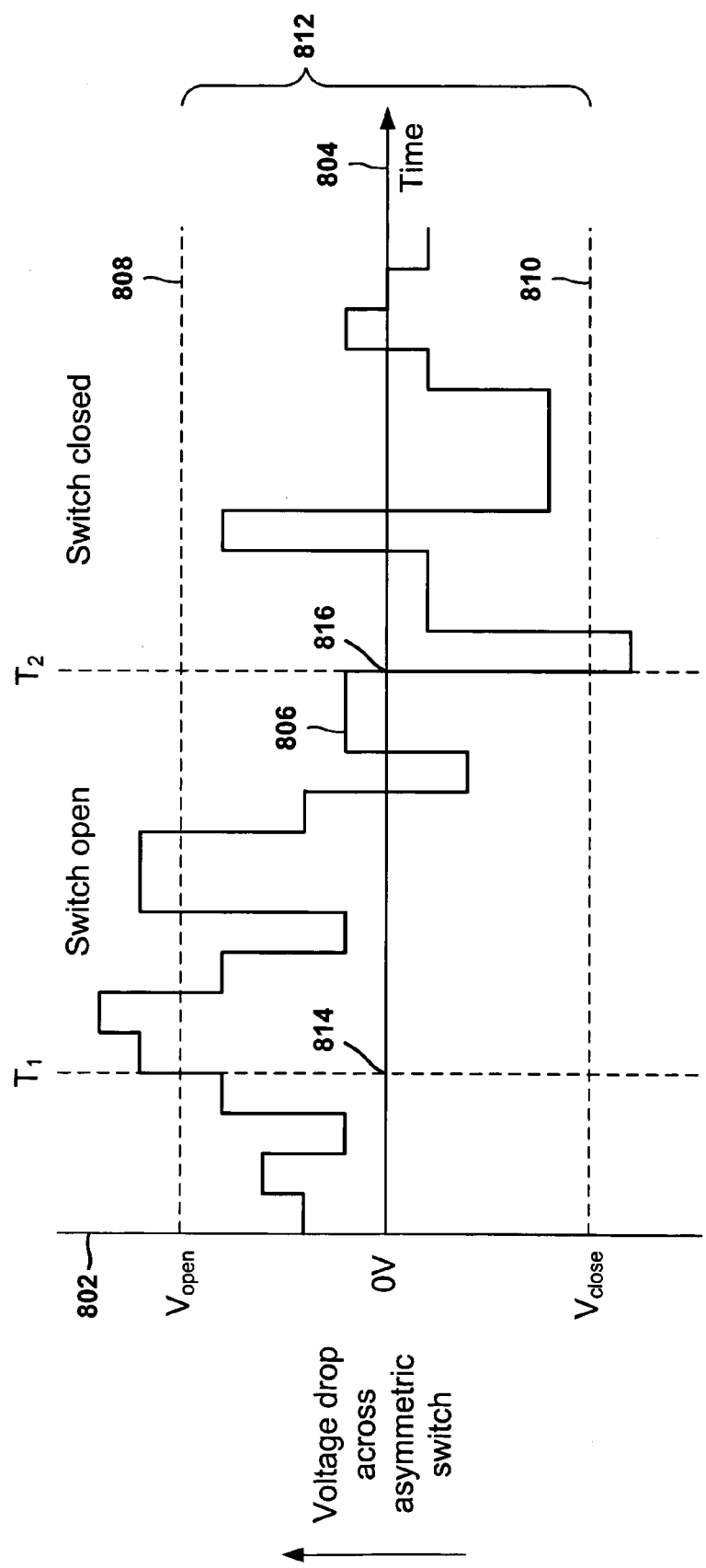
FIG. 8 illustrates a varying voltage drop across an asymmetric switch.

FIG. 8 illustrates a graph of variations in voltage drop across an asymmetric switch over a time interval. Vertical axis 802 represents a voltage drop across an asymmetric switch. Horizontal axis 804 represents time. As a hypothetical example, it is assumed that the asymmetric switch connects two nanowires. One nanowire, the reference nanowire, is maintained at 0V, while the other nanowire, the voltage-varying nanowire, is supplied with variable voltage levels 806. When a positive voltage is applied to the voltage-varying nanowire, a positive voltage drop is created across the asymmetric switch. When the positive voltage is equal to, or greater than, open threshold voltage $V_{open}$ 808 for a sufficient amount of time, the asymmetric switch goes into a high impedance state, or open position, allowing only a very small amount of current to flow between the asymmetric switch connecting the two nanowires. Conversely, when a negative voltage is applied to the voltage-varying nanowire, a negative voltage drop is created across the asymmetric switch. When the negative voltage drop across the asymmetric switch is equal to, or greater than, close threshold voltage $V_{close}$ 810 for a sufficient amount of time, the asymmetric switch goes into a low impedance state, or closed position. In the operating range 812 of the asymmetric switch, the voltage drop across the asymmetric switch is at any voltage between threshold voltage $V_{open}$ 808 and threshold voltage $V_{close}$ 810 in which case the current state of the asymmetric switch remains stable.

In FIG. 8, at time $T_1$ 814, the voltage drop rises above $V_{open}$ 808 for a sufficient amount of time to allow the asymmetric switch to transition to an open position. The voltage drop then fluctuates above and below threshold voltage $V_{open}$ 808, and the asymmetric switch therefore remains open until time $T_2$ 816, when the voltage drop falls below $V_{close}$ 810 for a sufficient amount of time to allow the asymmetric switch to transition to a closed position. The asymmetric switch remains in a closed position after time $T_2$ 816, since the voltage drop remains within the operating range.

Figure 9:
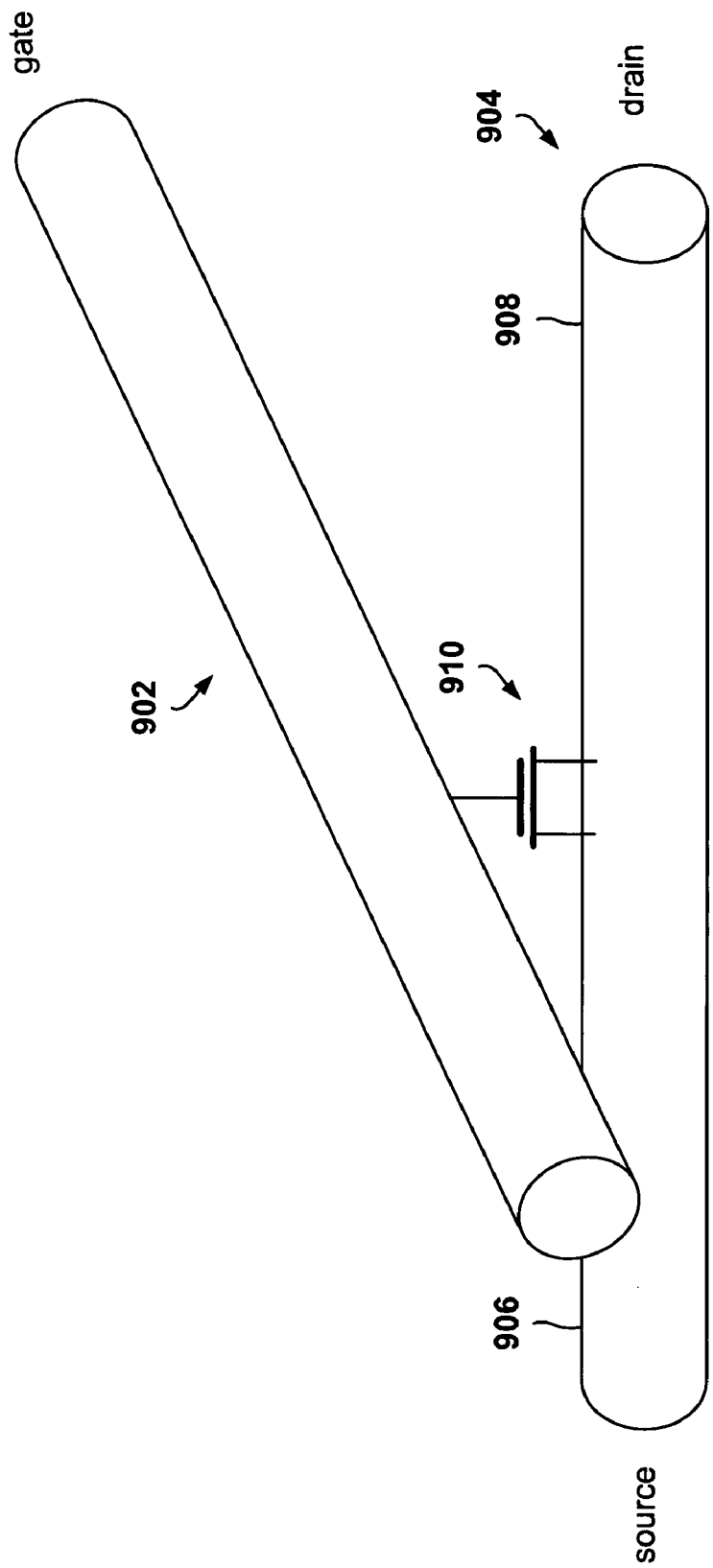
FIG. 9 illustrates a nanoscale FET junction located between a signal wire and an enable line.

As discussed in the first subsection, above, with reference to FIGS. 2-4, various electronic devices may be formed by different types of nanowires and/or nanowire-junction-spanning molecules. Nanowire junctions may or may not be reconfigurable. One type of selectively reconfigurable electronic device implemented by a nanowire junction is a field-effect transistor ("FET"). FIG. 9 illustrates an FET located between two overlapping nanowires. Nanowire 902 operates as a gate, while nanowire 904 operates as both a source 906, at one end, and a drain 908, at the opposing end, with FET 910 connecting gate nanowire 902 to source/drain nanowire 904. Application of specific voltages to gate nanowire 902 controls signal transmission across source/drain nanowire 904. When voltage $V_{enable}$ is applied to gate nanowire 902, source/drain nanowire 904 operates as though there is a low-impedance path between source 906 and drain 908, with the source and drain therefore electronically interconnected. When voltage $V_{disable}$ is applied to gate nanowire 902, source/drain wire 904 operates as though there is a high-impedance path between source 906 and drain 908, disconnecting the source from the drain.

Figure 10:
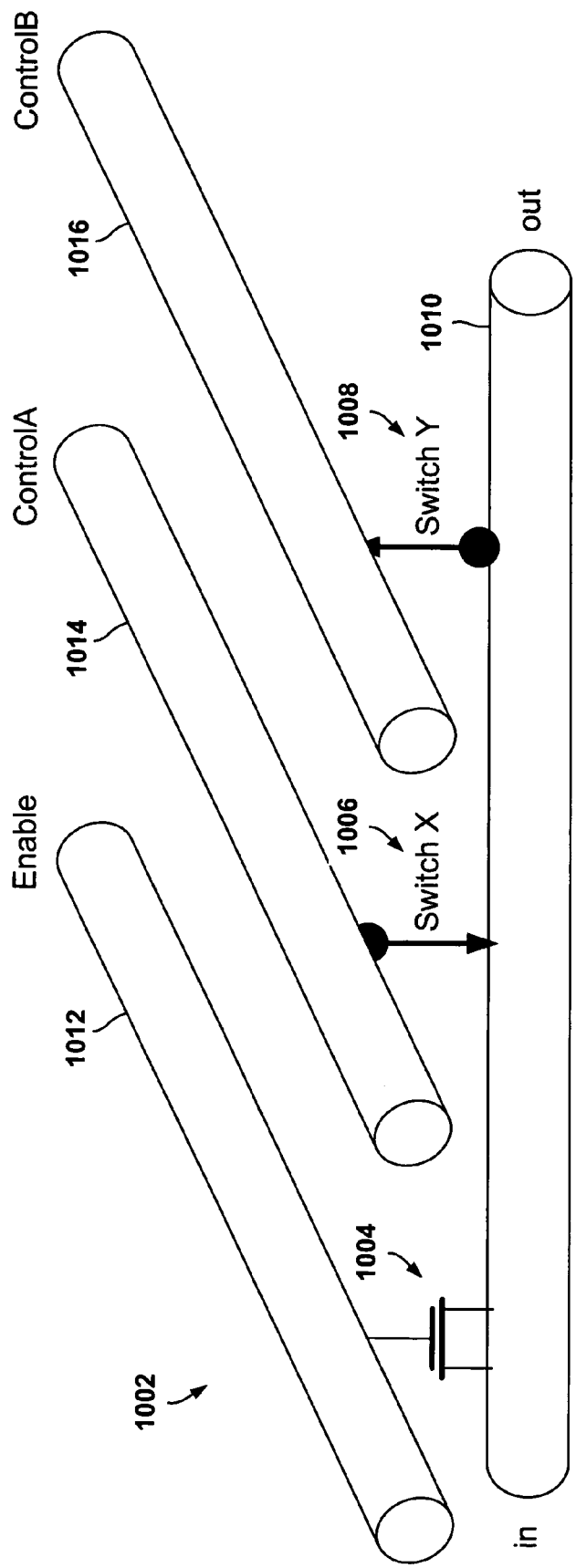
FIG. 10 illustrates a nanowire-crossbar latch.

FIG. 10 illustrates a nanowire-crossbar latch. Nanowire-crossbar latch 1002 includes FET 1004 and two asymmetric switches 1006 and 1008 implemented as three nanowire junctions connecting signal wire 1010 to enable line 1012, control line ControlA 1014, and control line ControlB 1016. Note that enable line 1012 operates as a gate nanowire and signal wire 1010 operates as a source/drain nanowire. Also note that the polarity of asymmetric switch 1006, labeled "Switch X" in FIG. 10, is opposite from the polarity of asymmetric switch 1008, labeled "Switch Y" in FIG. 10.

Figure 11:
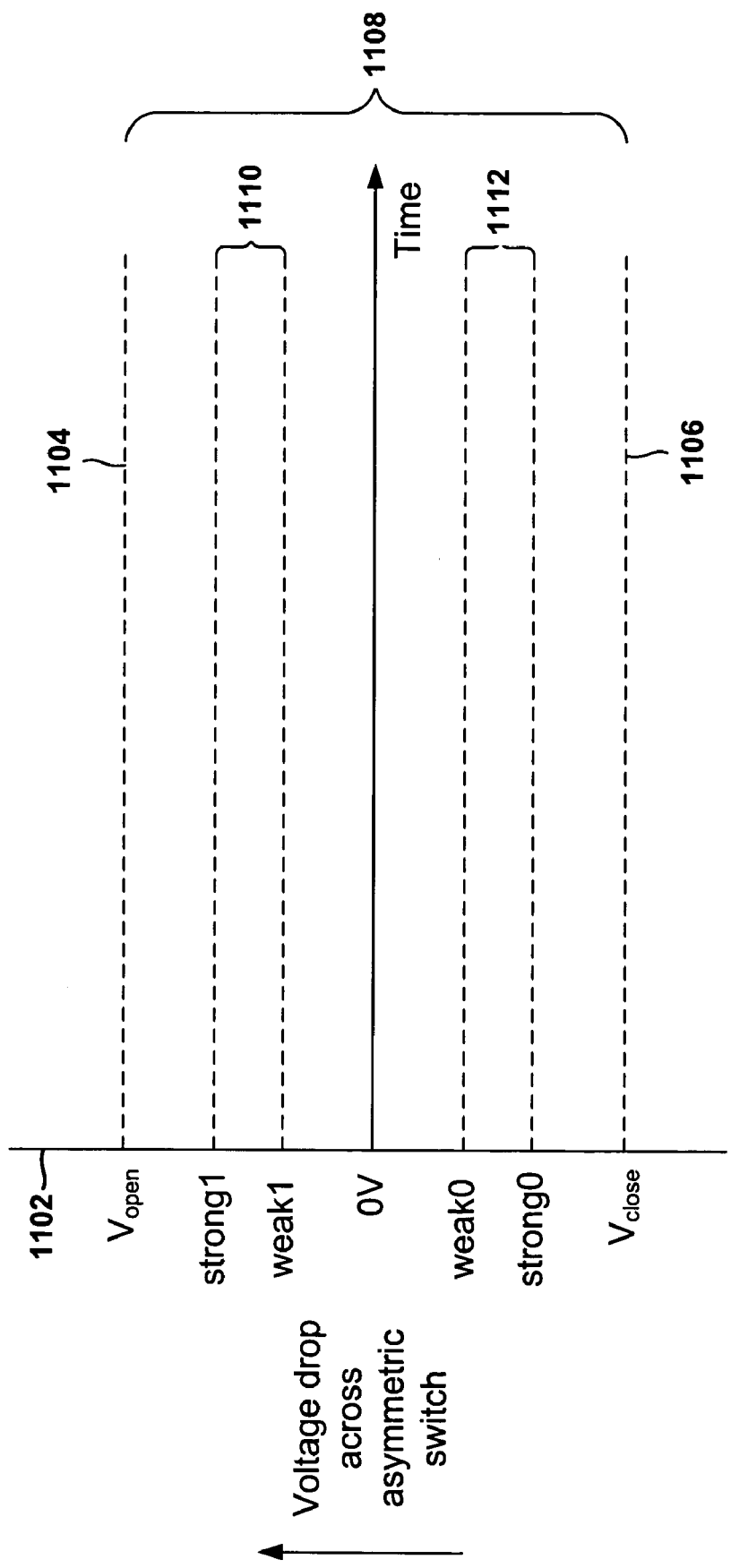
FIG. 11 is a graphical representation of hypothetical voltage levels that can be used during operation of the nanowire-crossbar latch shown in FIG. 10.

FIG. 11 is a graphical representation of hypothetical voltage levels that can be used during operation of the nanowire-crossbar latch shown in FIG. 10. Vertical axis 1102 represents a voltage drop between the signal wire and ControlA and between the signal wire and ControlB. Positive and negative voltages can be applied to ControlA and ControlB to create voltage drops which can open and close asymmetric switches connecting ControlA and ControlB to the signal line. Each asymmetric switch opens when a positive voltage drop across the asymmetric switch is greater than, or equal to, threshold voltage $V_{open}$ 1104, closes when a negative voltage drop across the asymmetric switch is greater than, or equal to, threshold voltage $V_{close}$ 1106, and remains stable when the voltage drop stays within an operating range 1108.

Voltage signals applied to the signal wire are confined to two ranges, positive range 1110 and negative range 1112, when the nanowire-crossbar latch is in a programming state. Range 1110 represents a logical "1," extending from voltage strong1, the initial value of "1," down to voltage weak1, the lowest value to which a logical "1" is permitted to fall. Similarly, range 1112 represents a logical "0," extending from voltage strong0 up to voltage weak0.

The nanowire-crossbar latch has two operating states: (1) a programming state, and (2) an output state. The current operating state of the nanowire-crossbar latch is determined by the voltage applied to the enable line. When the nanowire-crossbar latch is in a programming state, voltage $V_{enable}$ is applied to the enable line and the FET enables signals in the signal wire from a source, labeled "in" in FIG. 10, to a drain, labeled "out" in FIG. 10. Alternately, when the nanowire-crossbar latch is in an output state, voltage $V_{disable}$ is applied to the enable line and the FET disables signals in the signal wire from source to drain.

The nanowire-crossbar latch is operated by applying a sequence of voltage pulses to the control lines while the nanowire-crossbar latch is in the programming state. The programming-state-voltage-pulse sequence operates to store a logic variable into the nanowire-crossbar latch by specifically positioning the asymmetric switches. The logic variable, either a logical "0" or a logical "1," is input on the signal wire and the voltage pulse sequence sets the asymmetric switch positions based on the input signal.

Upon completion of the programming state, the nanowire-crossbar latch can be placed into an output state. During the output state, the input signal along the signal wire is disabled by the enable line. One of two sets of voltages is applied to the control lines. The specifically-positioned asymmetric switches operate to allow one of each set of control-line voltages to pass through one of the asymmetric switches to become the new signal-wire output. The other of the set of control-line voltages is blocked by an asymmetric switch in an open position. One set of the applied control-line voltages causes the signal wire to output a restored version of the signal input to the signal wire during the programming state, and the other set of applied control-line voltages causes the signal wire to output a restored and inverted version of the signal input to the signal wire during the programming state.

Figure 12A:
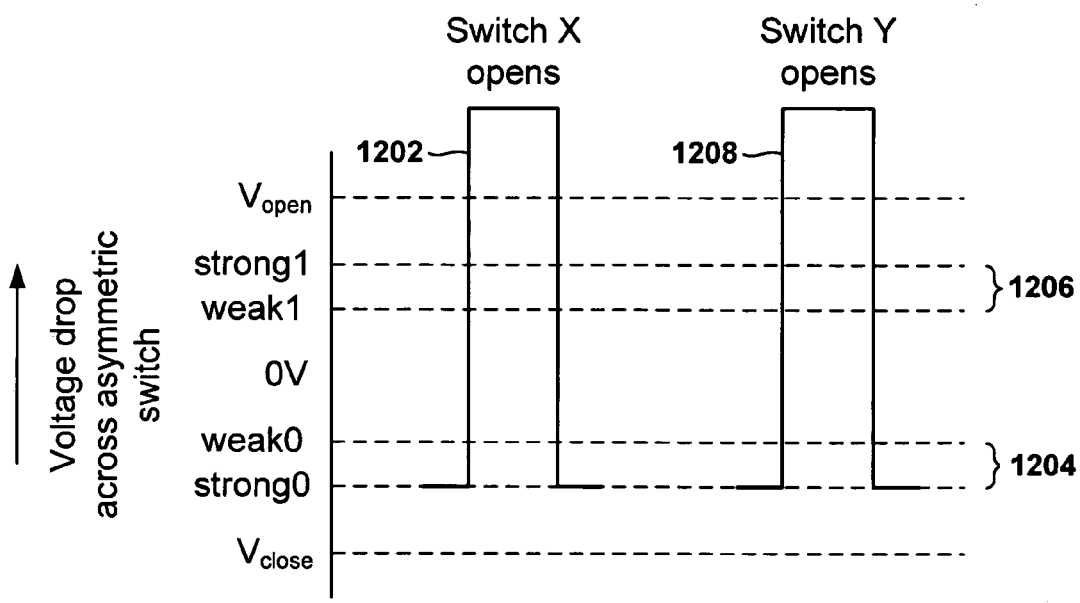
FIG. 12A illustrates two exemplary unconditional-open pulses applied to the control lines of a nanowire-crossbar latch.

FIGS. 12A-14B illustrate an exemplary voltage-pulse sequence, or latch protocol, applied to the control lines of the nanowire-crossbar latch while the nanowire-crossbar latch is in the programming state. The described voltage-pulse sequence comprises four voltage pulses. FIG. 12A illustrates two exemplary unconditional-open pulses applied to the control lines of a nanowire-crossbar latch. The first pulse is an unconditional-open-voltage pulse applied to ControlA. A sufficiently low negative voltage-pulse 1202 is applied to ControlA to open Switch X (1006 in FIG. 10), regardless of the current voltage applied to the signal wire, provided that voltage applied to the signal wire is within one of the two ranges from strong0 to weak0 1204 and from strong1 to weak1 1206. The second voltage pulse is an unconditional-open pulse applied to ControlB. A sufficiently high positive voltage 1208 is applied to ControlB to open Switch Y (1008 in FIG. 10), regardless of the current voltage applied to the signal wire, provided the voltage applied to the signal wire is within one of the two ranges from strong0 to weak0 1204 and from strong1 to weak1 1206.

Figure 12B:
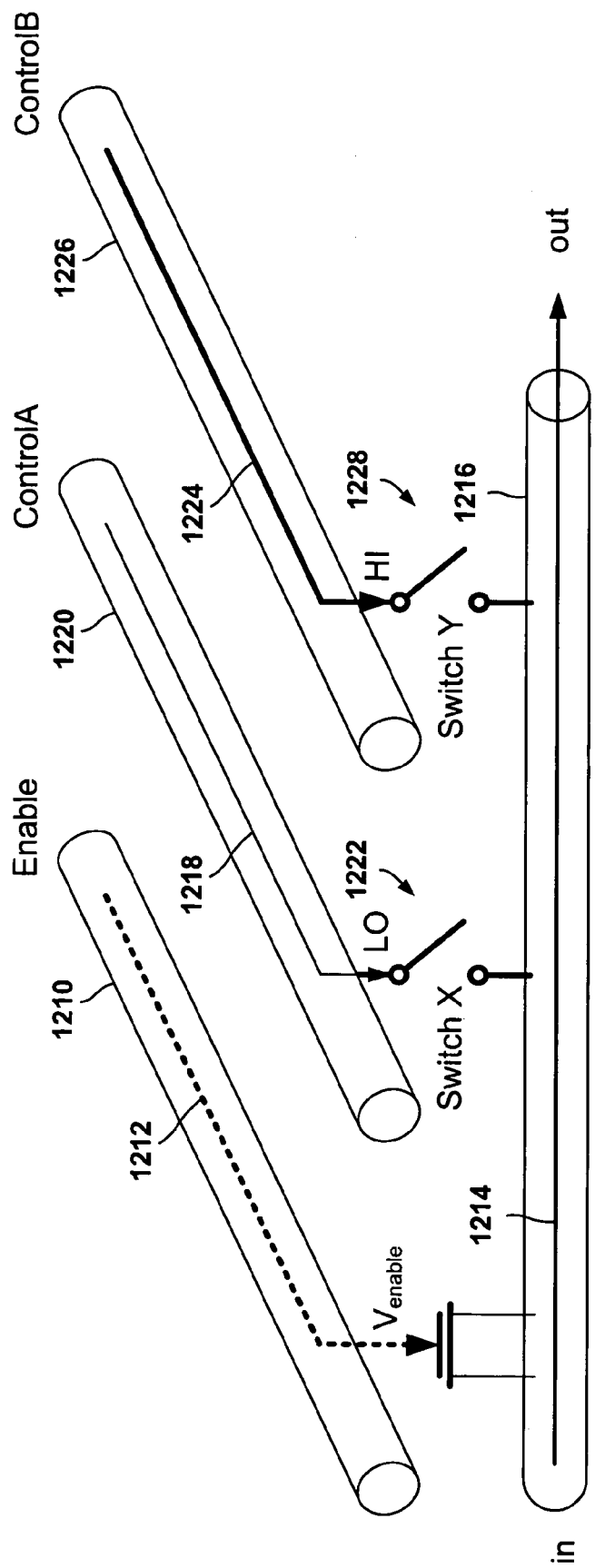
FIG. 12B illustrates two exemplary unconditional-open pulses applied to the control lines of a nanowire-crossbar latch.

FIG. 12B illustrates two exemplary unconditional-open pulses applied to the control lines of a nanowire-crossbar latch. Voltage $V_{enable}$ 1212 is applied to enable line 1210 during the programming state. Voltage $V_{enable}$ 1212 is shown in FIG. 12B by a dashed line. Signal 1214 is applied to signal wire 1216. Signal 1214 can be either a logical "0" or a logical "1." A positive voltage drop is needed to open Switch X. As shown in FIG. 10, the polarity of Switch X is such that the voltage drop across Switch X is referenced from the voltage of ControlA. Since the voltage of signal line 1216 is either a logical "0" or a logical "1," lowering the voltage of ControlA can create the needed positive voltage drop across Switch X. Accordingly, the unconditional-open-voltage pulse 1218 is applied to ControlA 1220 is a negative voltage labeled "LO" and indicated in FIG. 12B by a thin line. The polarity of Switch Y is opposite from Switch X. Thus, the unconditional-open-voltage pulse 1224 applied to ControlB 1226 to open Switch Y 1228 is a positive voltage labeled "HI" and indicated in FIG. 12B by a thick line.

Figure 13A:
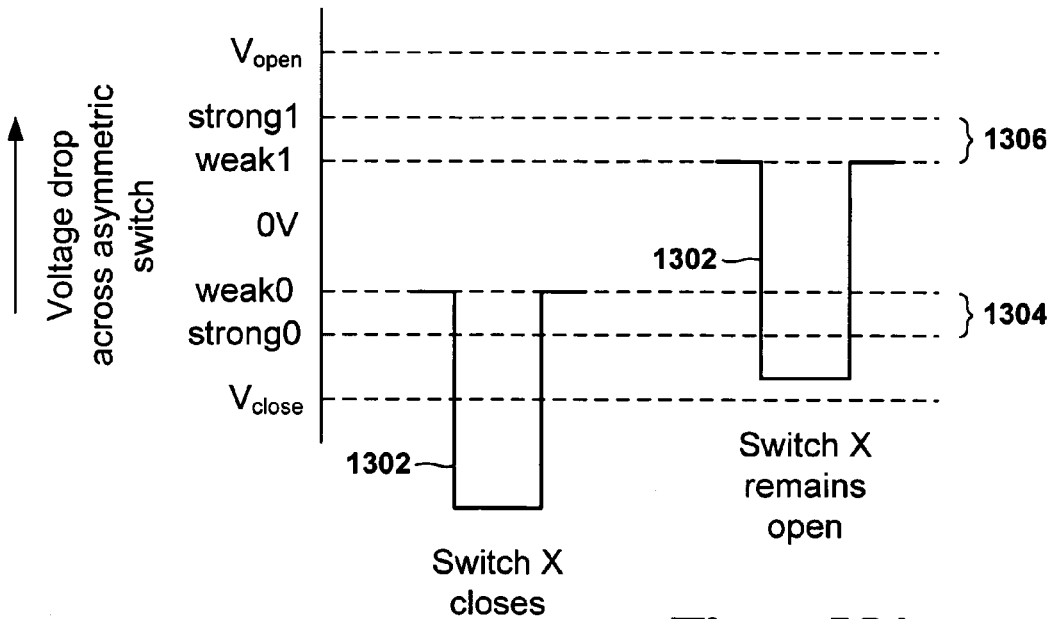
FIG. 13A illustrates two possible switch operations resulting from an exemplary conditional-close pulse applied to the control lines of a nanowire-crossbar latch.

A third voltage pulse is a conditional-close voltage pulse applied to ControlA. FIG. 13A illustrates two possible switch operations resulting from an exemplary conditional-close pulse applied to the control lines of a nanowire-crossbar latch. In FIG. 13A, two possible switch positions are shown resulting from the third, conditional-close voltage pulse, depending on whether a logical "0" 1304 or a logical "1" 1306 is applied to the signal wire. A sufficiently-high positive voltage is applied to ControlA to create conditional-close voltage pulse 1302 that closes Switch X when a logical "0" 1304 is being applied to the signal wire, but leaves Switch X open when a logical "1" 1306 is applied to the signal wire.

Figure 13B:
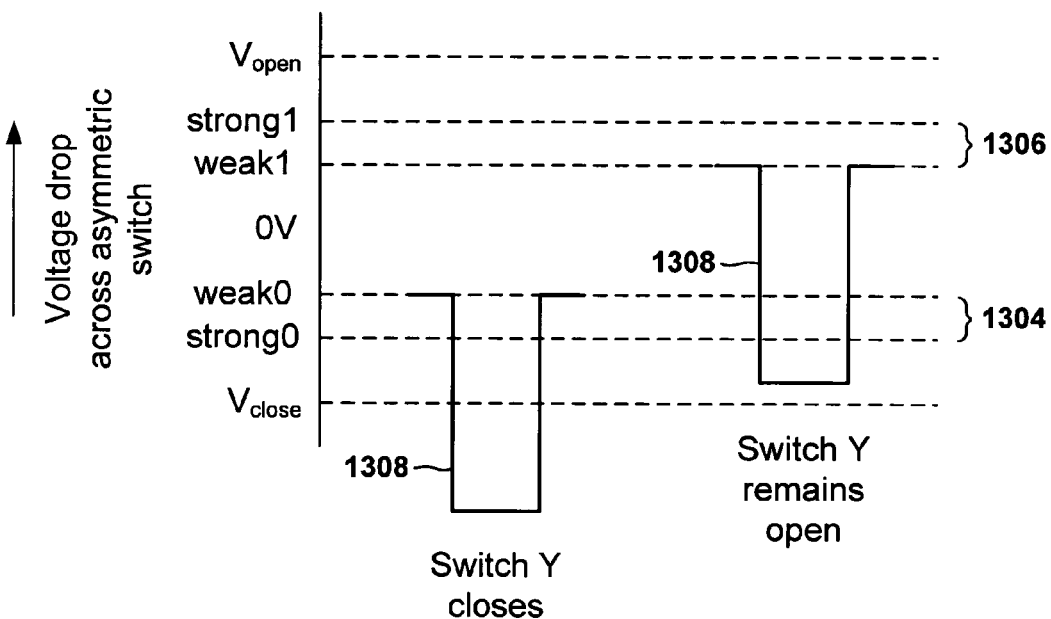
FIG. 13B illustrates two possible switch operations resulting from an exemplary conditional-close pulse applied to the control lines of a nanowire-crossbar latch.

A fourth pulse of the latch protocol is a conditional-close voltage pulse applied to ControlB. FIG. 13B illustrates two possible switch operations resulting from an exemplary conditional-close pulse applied to the control lines of a nanowire-crossbar latch. In FIG. 13B, two possible switch positions are shown resulting from a conditional voltage pulse, depending on whether a logical "0" 1304 or a logical "1" 1306 is applied to the signal wire. A sufficiently-low negative voltage is applied to ControlB to create a conditional-close voltage pulse 1308 that closes Switch Y when a logical "0" 1304 is applied to the signal wire, but leaves Switch Y open when a logical "1" 1306 is applied to the signal wire. Note the voltage-pulse sequence may be performed in either of two alternative orders. Switch Y can be unconditionally opened before Switch X, or Switch Y can be conditionally opened before Switch X.

Figure 14B:
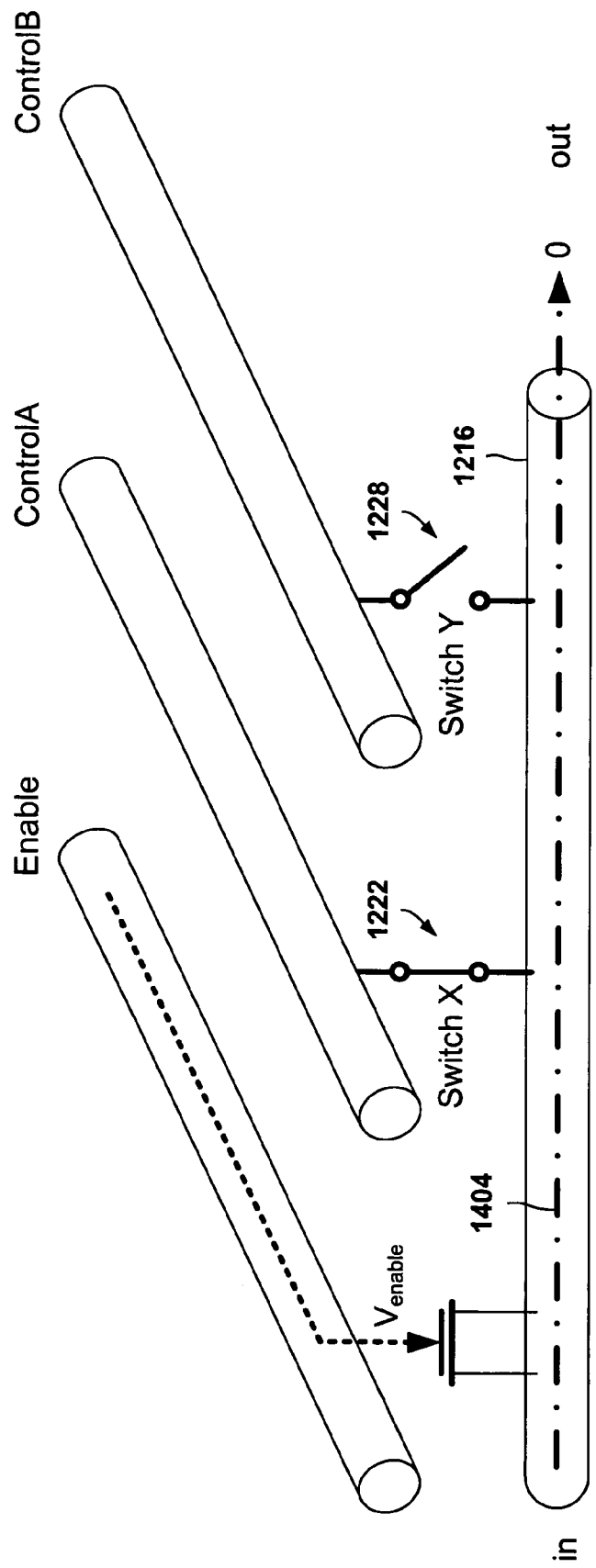

Following the voltage-pulse sequence, one of two possible switch positions are in place along a nanowire-crossbar latch, depending on whether a logical "0" or a logical "1" is being applied to the signal wire during a voltage-pulse sequence. FIGS. 14A-14B illustrate two possible switch positions following the exemplary pulse sequence shown in FIGS. 12A-13B, for the exemplary nanowire-crossbar latch shown in FIG. 10. FIG. 14A shows the switch positions within the nanowire-crossbar latch following application of a voltage-pulse sequence when a logical "1" is applied to the signal wire during the voltage-pulse sequence. The first voltage pulse causes Switch X to open, as shown by FIG. 12B. However, the conditional voltage pulse of FIG. 13A does not exceed the voltage threshold due to the logical "1" 1402 being applied to signal wire 1216. Thus, after the voltage-pulse sequence, Switch X 1222 is open. Conversely, the first voltage pulse opened Switch Y and the conditional-voltage pulse of FIG. 13B closed Switch Y. Thus, after the voltage-pulse sequence Switch Y 1228 is closed. FIG. 14B shows the opposite result when a logical "0" is being to signal wire 1216 during the voltage-pulse sequence. Signal logical "0" 1404 is denoted by a line of alternating dashes and dots. The voltage pulse sequence causes Switch X 1222 to be in a closed position and Switch Y 1228 to be in an open position.

Once the asymmetric switch positions have been set by the voltage pulse sequence, the nanowire-crossbar latch can enter the output state. During the output state, one of two pairs of opposite voltages is applied to ControlA and ControlB. The applied control-line voltages encounter one of two possible sets of switch positions shown in FIGS. 14A-14B. The output state is initiated by driving the enable line with voltage $V_{disable}$. As discussed above with reference to FIG. 9, applying voltage $V_{disable}$ effectively disables signals on the signal wire.

Figure 15A:
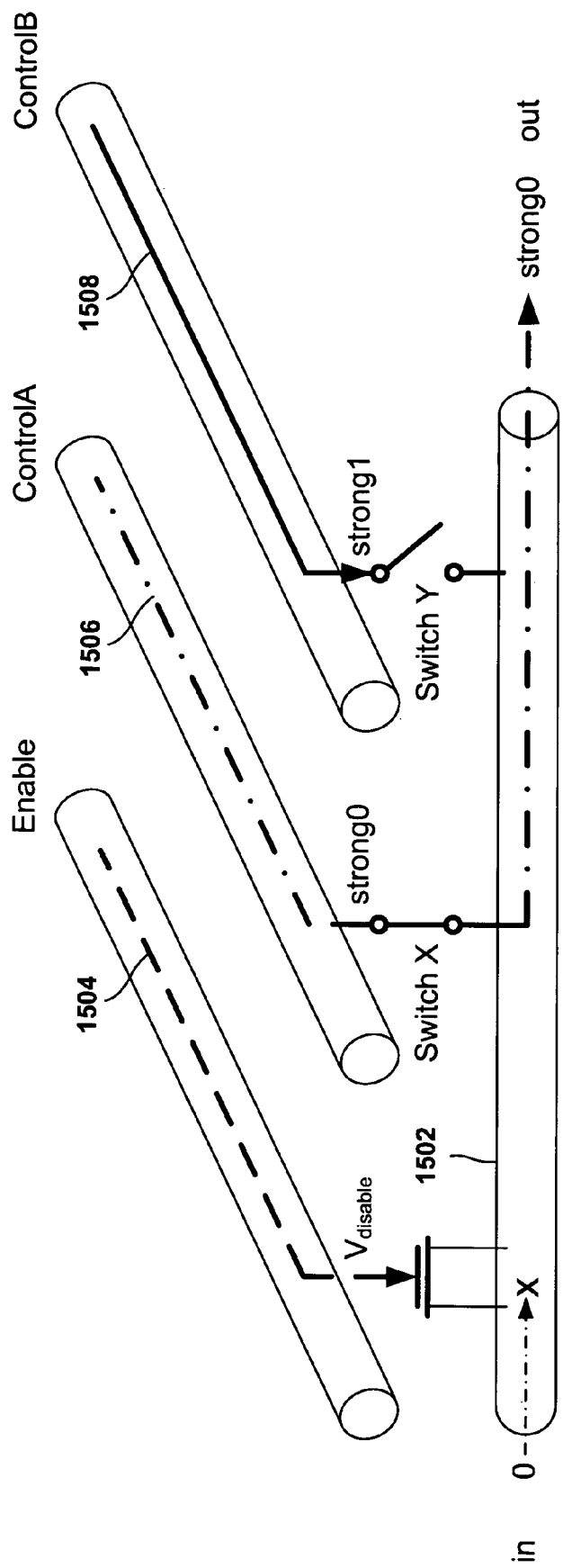
FIGS. 15A-15B illustrate two possible signal-wire-output signals following the exemplary pulse sequence shown in FIGS. 12A-13B, for the exemplary nanowire-crossbar latch shown in FIG. 10.
Figure 15B:
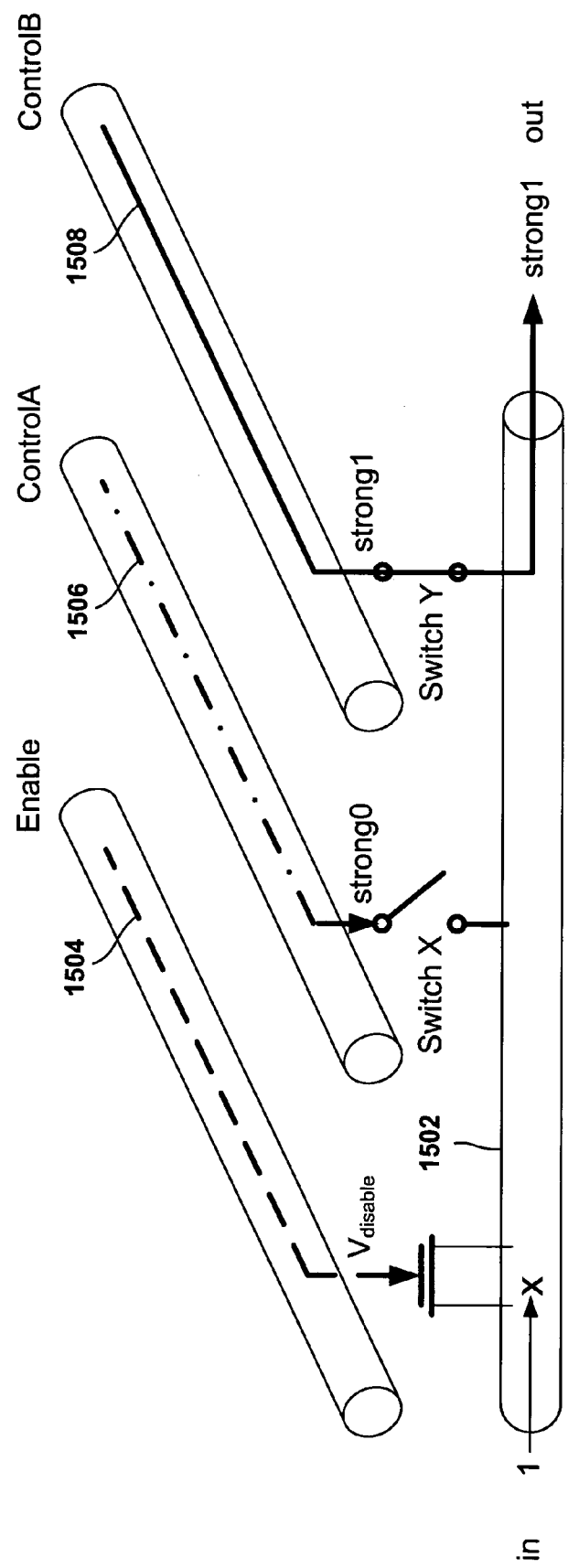

Signals applied to the signal wire are disabled and replaced with either a restored true signal or a restored inverted signal during the output state. FIGS. 15A-15B illustrate two possible signal-wire-output signals following the exemplary pulse sequence shown in FIGS. 12A-13B, for the exemplary nanowire-crossbar latch shown in FIG. 10. The signals output to the signal line in FIGS. 15A-15B are restored true signals output in response to application of a logical strong0 voltage to ControlA and application of a logical strong1 voltage to ControlB. As shown in FIG. 15A, a logical "0" input signal is applied to signal wire 1502 and is denoted by a line with alternating dashes and dots on the left-hand side of signal wire 1502. Voltage $V_{disable}$ 1504, denoted by a dashed line, is applied to the enable line. Voltage $V_{disable}$ 1504 disables the logical "0" signal in signal wire 1502, as shown by an "X." Voltage strong0 1506, denoted by a line of alternating dashes and dots, is applied to ControlA and voltage strong1 1508 is applied to ControlB. Voltage strong0 1506 passes through Switch X and continues out signal wire 1502, while voltage strong1 1508 does not pass through open Switch Y. Note that the strong0 signal output from signal wire 1502 is shown in a thicker gauge than the logical "0" signal input to signal wire 1502 to emphasize that the signal output is generally a stronger signal than the signal input. The logical "0" signal input to the signal wire 1502 may have fallen due to a low level due to one or more factors such as: noise, resistive losses, and diode drops. The signal output from the signal wire 1502 is a strong0 control-line voltage.

As shown FIG. 15B, a logical "1" is applied to signal wire 1502. The input logical "1" signal is disabled by voltage $V_{disable}$ 1504. Voltage strong1 1508 passes through Switch Y and continues out signal wire 1502, while voltage strong0 1506 does not pass through open Switch X. Note that the strong1 signal output from signal wire 1502 is shown in a thicker gauge than the logical "1" signal input to signal wire 1502 to emphasize that the signal output is generally a stronger signal than the signal input. The logical "1" signal input to the signal wire 1502 may have fallen due to a low level due to one or more factors such as: noise, resistive losses, and diode drops. The signal output from the signal wire 1502 is a strong1 control-line voltage.

Figure 16A:
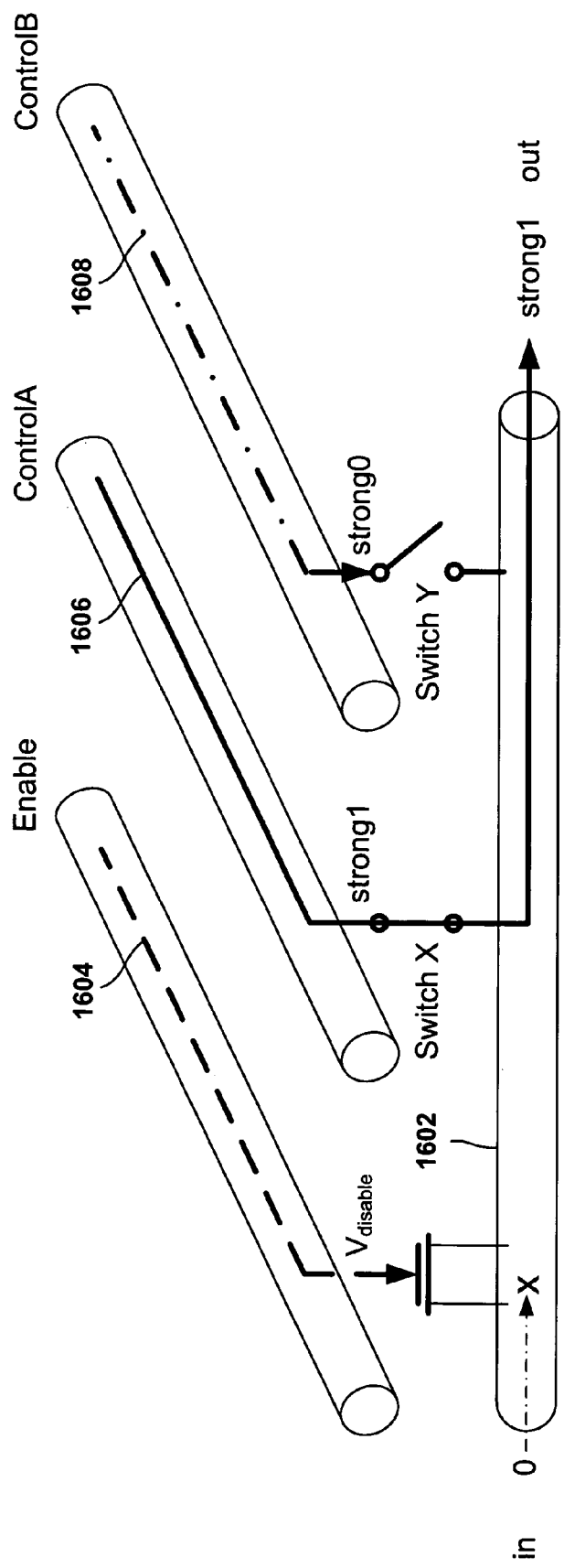
FIGS. 16A-16B illustrate two possible signal-wire-output signals following the exemplary pulse sequence shown in FIGS. 12A-13B, for the exemplary nanowire-crossbar latch shown in FIG. 10.
Figure 16B:
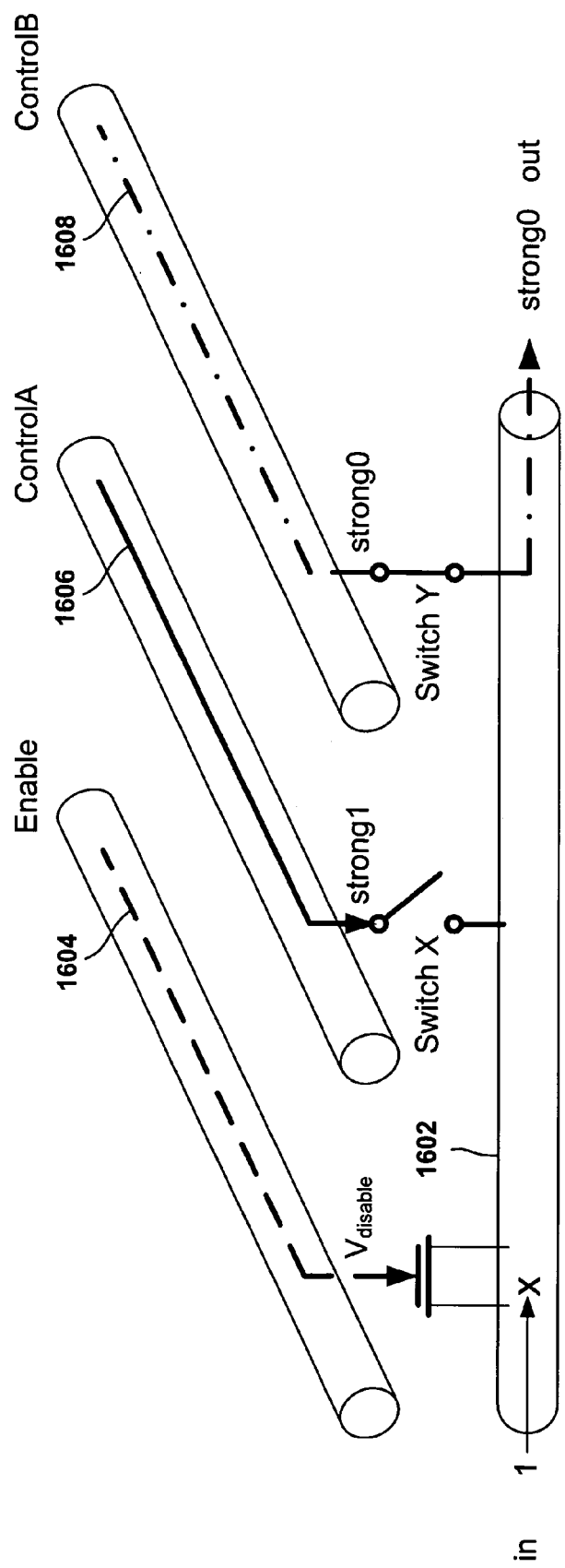

FIGS. 16A-16B illustrate two possible signal-wire-output signals following the exemplary pulse sequence shown in FIGS. 12A-13B, for the exemplary nanowire-crossbar latch shown in FIG. 10. The signals output to the signal line in FIGS. 16A-16B are restored, inverted signals output in response to application of a logical strong1 voltage to ControlA and application of a logical strong0 voltage to ControlB. As shown in FIG. 16A, a logical "0" input signal is applied to signal wire 1602 and is denoted by a line of alternating dashes and dots on the left-hand side of signal wire 1602. Voltage $V_{disable}$ 1606, denoted by a dashed line, is applied to the enable line. Voltage $V_{disable}$ 1606 disables the logical "0" signal in signal wire 1602, as shown by an "X" in FIG. 16A. Voltage strong1 1606 is applied to ControlA and voltage strong0 1608, denoted by a line with alternating dashes and dots, is applied to ControlB. Voltage strong1 1606 passes through Switch X and continues to signal wire 1602, while voltage strong0 1608 does not pass through open Switch Y. Note that the strong1 signal output from signal wire 1602 is shown in a thicker gauge than the logical "0" signal input to signal wire 1602 to emphasize that the signal output is generally a stronger signal than the signal input. The logical "0" signal input to the signal wire 1602 may have fallen due to a low level due to one or more factors such as: noise, resistive losses, and diode drops. The signal output from the signal wire 1602 is a strong1 control-line voltage.

In FIG. 16B, a logical "1" is applied to signal wire 1602. The input logical "1" signal is disabled by voltage $V_{disable}$ 1606. Voltage strong0 1608 passes through Switch Y and continues to signal wire 1602, while voltage strong1 1606 does not pass through open Switch X. Note that the strong0 signal output from signal wire 1602 is shown in a thicker gauge than the logical "1" signal input to signal wire 1602 to emphasize that the signal output is generally a stronger signal than the signal input. The logical "1" signal input to the signal wire 1602 may have fallen due to a low level due to one or more factors such as: noise, resistive losses, and diode drops. The signal output from the signal wire 1602 is a strong0 control-line voltage.

Nanowire-Crossbar-Latch-Array Embodiments of the Present Invention

Figure 17:
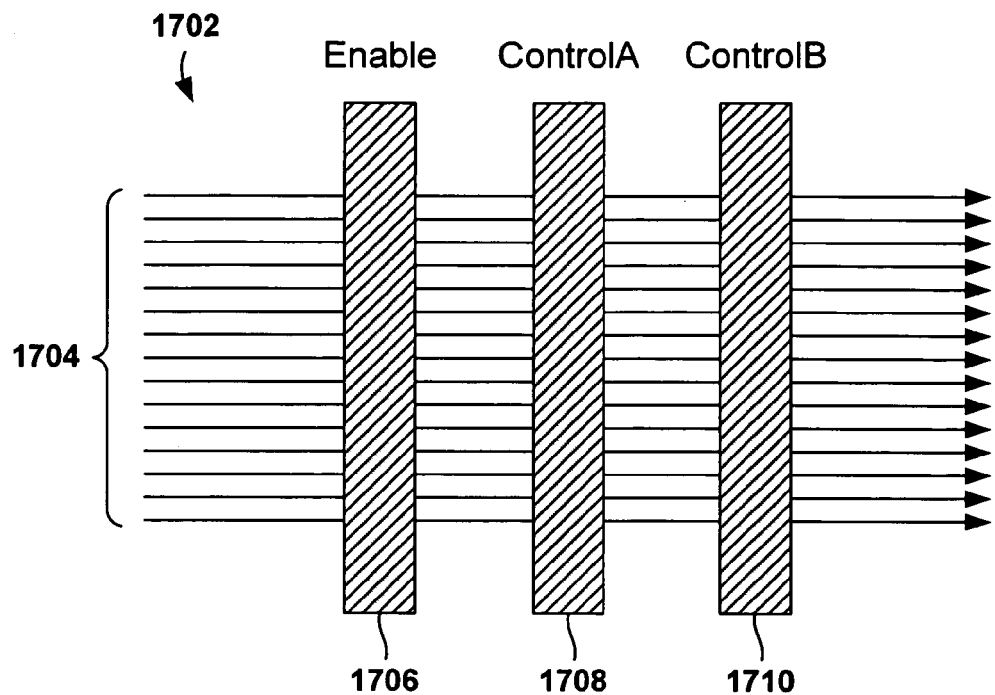
FIG. 17 illustrates a nanowire-crossbar latch array that represents one embodiment of the present invention.

Nanowire-crossbar latch arrays can be implemented by intersecting more than one signal wire with the three control lines of the nanowire-crossbar latch described in the previous subsection. FIG. 17 illustrates a nanowire-crossbar latch array that represents one embodiment of the present invention. Nanowire-crossbar latch array 1702 includes a number of signal wires 1704, with nanowire junctions between each signal wire and enable line 1706, ControlA 1708, and ControlB 1710. Each nanowire-crossbar latch within nanowire-crossbar latch array 1702 comprises a single signal wire and three nanowire junctions interconnecting the single signal wire with enable line 1706, ControlA 1708, and ControlB 1710. Each nanowire-crossbar latch operates in the manner of the nanowire-crossbar latch discussed with reference to FIGS. 10-16B. For simplicity of illustration, the vertical lines are shown as vertical cross-hatched rectangles. This illustration convention is used in subsequent figures. Each nanowire-crossbar latch within nanowire-crossbar latch array 1702 is oriented to operate from left to right, as shown by directional arrows on signal wires 1704. Additionally, one of the layers of wires can be of a scale other than nanoscale, such as microscale or sub-microscale. For instance, the signal wires can be nanowires while the enable line and control lines can be microscale or sub-microscale wires or the signal wires can be microscale or sub-microscale wires while the enable line and control lines can be nanowires.

Figure 18:
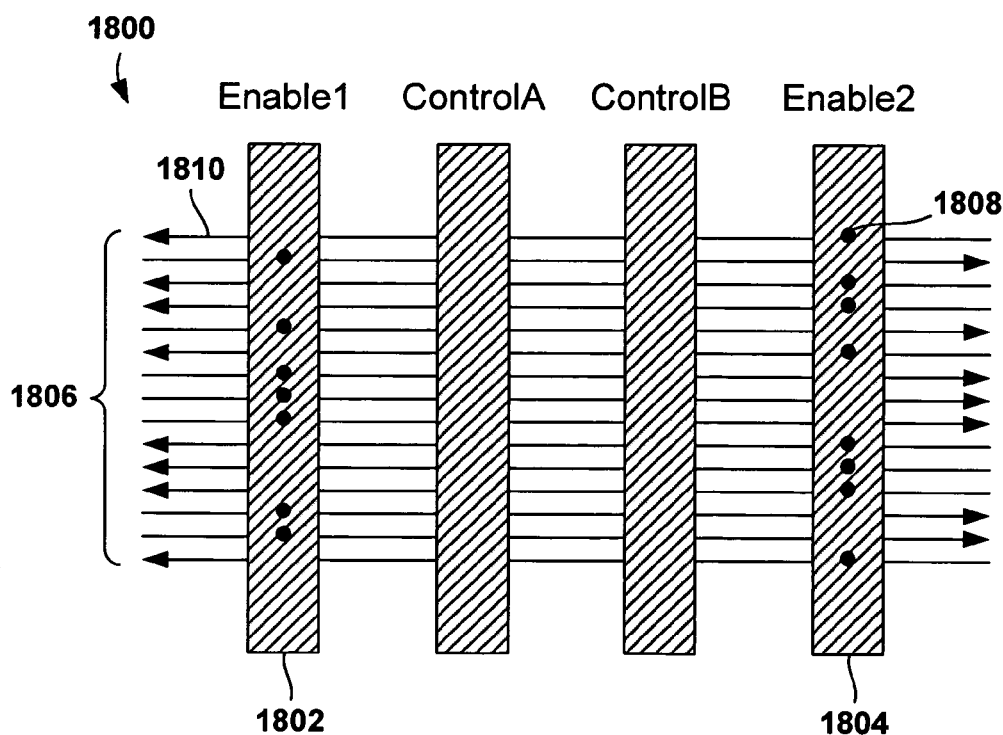
FIG. 18 illustrates an exemplary nanowire-crossbar latch array utilizing two enable lines that represents one embodiment of the present invention.

In a different embodiment of the nanowire-crossbar latch array, a second enable line is included in the nanowire-crossbar latch array to implement two possible directions of nanowire-crossbar latch operation. FIG. 18 illustrates an exemplary nanowire-crossbar latch array utilizing two enable lines that represents one embodiment of the present invention. Nanowire-crossbar latch array 1800 includes two enable lines, enable line 1802, labeled "Enable1" in FIG. 18, and enable line 1804, labeled "Enable2" in FIG. 18, forming nanowire junctions with multiple signal wires 1806. Each enable-line/signal-wire junction can be programmed, by applying suitable voltages to each enable line and each signal wire connected by the programmable nanowire junction, to be: (1) an FET, which produces either a low-impedance path or a high-impedance path across the signal wire or (2) a high resistance nanowire junction. Black circles, such as black circle 1808, indicate that an enable-line/signal-wire junction is an FET. High resistance enable-line/signal-wire junctions are unmarked. Note that, for each signal wire in FIG. 18, one enable-line/signal-wire junction is an FET, and one enable-line/signal-wire junction is a variable-resistance nanowire junction. The direction of operation of each nanowire-crossbar latch is determined by which enable-line/signal-wire junction operates as an FET, and which enable-line/signal-wire junction is permanently open. Directional arrows on signal wires, such as directional arrow 1810, indicate the direction of operation of each nanowire-crossbar latch. Note that, when the enable-line/signal-wire junction connected to Enable1 1802 is an FET, the nanowire-crossbar latch operates from left to right. Conversely, when the enable-line/signal-wire junction connected to Enable2 1804 is an FET, the nanowire-crossbar latch operates from right to left.

Bidirectional nanowire-crossbar latch operations within a nanowire-crossbar latch array may allow for efficient fabrication of larger structures, such as buffer arrays, within a bus. Nanowire-crossbar latch arrays can be combined with nanowire-logic arrays to restore degraded logic-signal levels in two directions. Implementation of combined nanowire-crossbar-latch-array/nanowire-crossbar-logic-array structures using unidirectional-latch arrays can leave unused one or more individual nanowire-crossbar latches within a nanowire-crossbar latch array. Implementation of bidirectional nanowire-crossbar latch arrays may be combined with nanowire-crossbar logic arrays to perform the same functions as unidirectional nanowire-crossbar latch arrays, with fewer nanowire-crossbar latches and/or fewer nanowire-crossbar latch arrays.

Figure 19A:
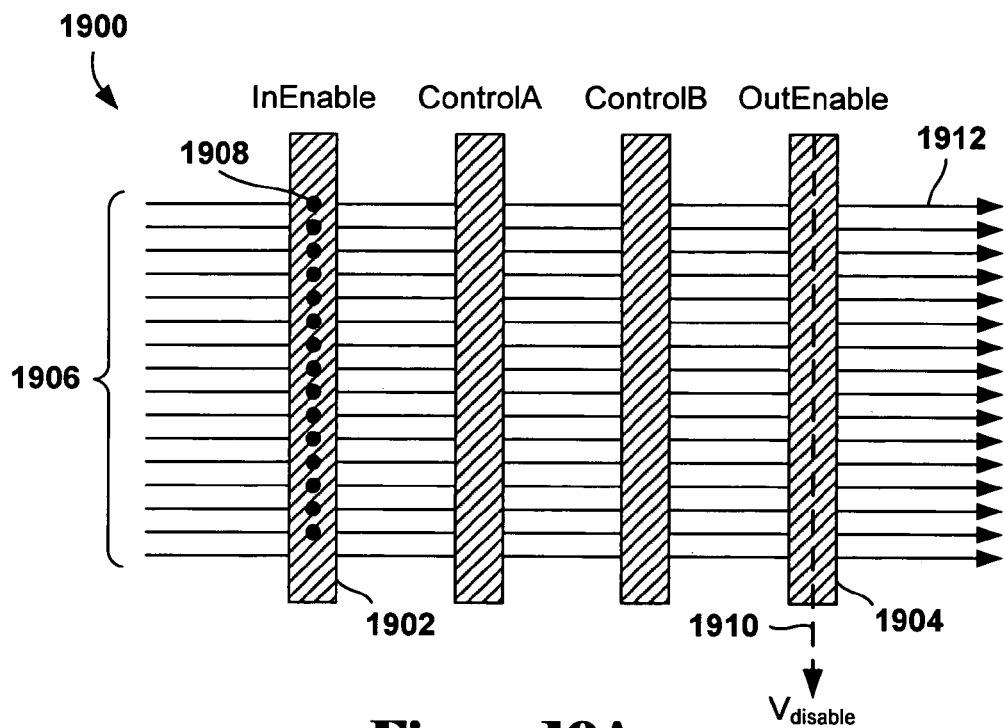
FIGS. 19A-19B illustrate an exemplary nanowire-crossbar latch array utilizing two enable lines that represents one embodiment of the present invention.
Figure 19B:
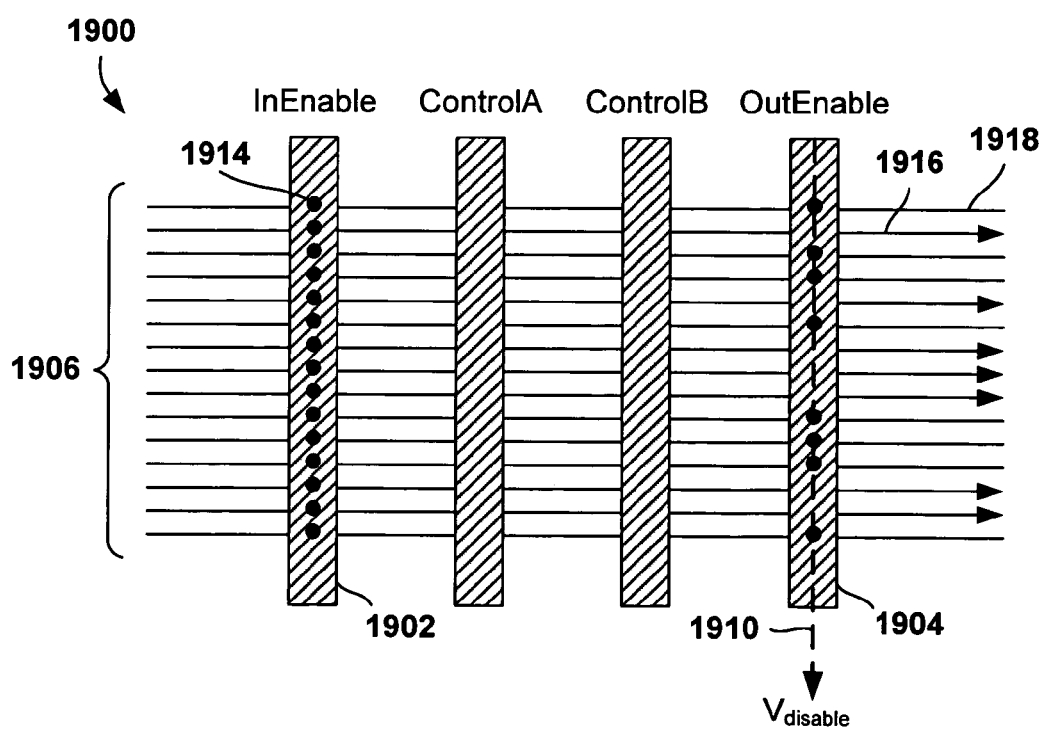

In another embodiment two enable lines are implemented into a nanowire-crossbar latch array, which allow one or more nanowire-crossbar-latch outputs to be disabled. FIG. 19A-19B illustrate an exemplary nanowire-crossbar latch array utilizing two enable lines that represents one embodiment of the present invention. The two enable lines, enable line 1902, labeled "InEnable" in FIG. 19A-19B, and enable line 1904, labeled "OutEnable" in FIG. 19A-19B, form nanowire junctions with a number of signal wires 1906. Each enable-line/signal-wire junction can be programmed, by applying suitable voltages to each enable line and each signal wire connected by the programmable nanowire junction, to be: (1) an FET, which produces either a low-impedance path or a high-impedance path across the signal wire; or (2) a high resistance nanowire junction.

Black circles, such as black circle 1908, indicate that an enable-line/signal-wire junction is an FET. High resistance enable-line/signal-wire junctions are unmarked. In FIG. 19A, each enable-line/signal-wire junction connected to enable line 1902 is an FET, and each enable-line/signal-wire junction connected to enable line 1904 is a high resistance nanowire junction. Voltage $V_{disable}$ 1910, represented by a dashed line, is constantly applied to enable line 1904. Directional arrows on the signal wires, such as directional arrow 1912, indicate signal movement in each signal wire. The constant $V_{disable}$ voltage 1910 applied to enable line 1904 does not affect signal movement in signal wires 1906.

In FIG. 19B, each enable-line/signal-wire junction connected to enable line 1902 is an FET, while a portion of the enable-line/signal-wire junctions connected to enable line 1904 are FETs and a portion of the enable-line/signal-line junctions connected to enable line 1904 are high resistance nanowire junctions. Constant application of voltage $V_{disable}$ 1910 to enable line 1904 disables signals in signal wires with FET connections with enable line 1904 and does not disable signals in signal wires with high resistance nanowire junction connections with enable line 1904. Directional arrows at the end of the signal wires, such as directional arrow 1916, indicate signal movement in signal wires with a high resistance nanowire junction connection with enable line 1904, and signal wires lacking a directional arrow, such as signal wire 1918, indicate a disabled signal in a signal wire with an FET connection to enable line 1904, caused by application of voltage $V_{disable}$ 1910 to enable line 1904.

Figure 20:
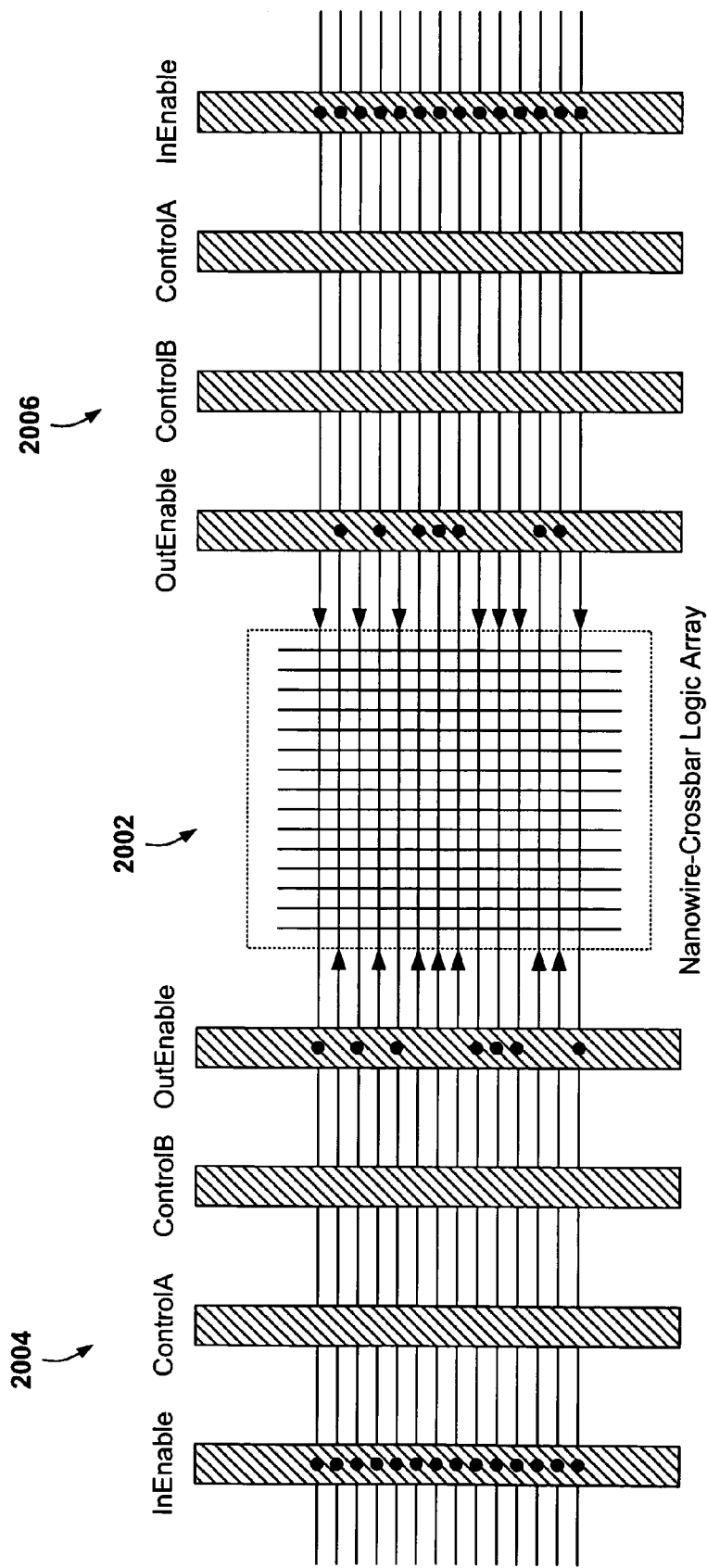
FIG. 20 illustrates two exemplary selectively-disabling nanowire-crossbar latch arrays used in conjunction with a nanowire-logic array that represents one embodiment of the present invention.

The current embodiment of the nanowire-crossbar latch array allows for efficient fabrication of larger structures. FIG. 20 illustrates two exemplary, selectively-disabling nanowire-crossbar latch arrays used in conjunction with a nanowire-logic array that represents one embodiment of the present invention. Signals within nanowire-crossbar logic array 2002 can be supplied by a nanowire-crossbar latch from either of two different nanowire-crossbar latch arrays 2004 and 2006. Thus, two input sources are available to efficiently supply signals to nanowire-crossbar logic array 2002 and provide additional routing capability. Note that nanowire-crossbar latch arrays 2004 and 2006 are oppositely oriented, with signals moving into nanowire-crossbar logic array 2002 from either of two directions.

Although the present invention has been described in terms of a particular embodiment, it is not intended that the invention be limited to this embodiment. Modifications within the spirit of the invention will be apparent to those skilled in the art. For example, the number of signal wires within a nanowire-crossbar latch array can vary greatly. Large numbers of signal wires can be controlled by two control lines and one or more enable lines. Combinations of alternate embodiments may be employed. For instance, register files may include an Enable2 line or an OutEnable line to create a bidirectional register file or a selective-signal disabling register file. Nanowire-crossbar latches and nanowire-crossbar latch arrays can be oriented in opposite directions. For example, signals within unidirectional signal lines can be oriented to travel right-to-left instead of left-to-right.

The foregoing detailed description, for purposes of illustration, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description; they are not intended to be exhaustive or to limit the invention to the precise forms disclosed. Obviously many modifications and variation are possible in view of the above teachings. The embodiments were chosen and described in order to best explain the principles of the invention and its practical applications and to thereby enable others skilled in the art to best utilize the invention and various embodiments with various modifications as are suited to the particular use contemplated.

The invention claimed is:

1. A nanowire-crossbar latch array for storing input signals, the nanowire-crossbar latch array comprising:
   a number of signal wires;
   a first enable line crossing each signal wire, the first enable line interconnected to each signal wire by one of a field-effect-transistor nanowire junction and a high resistance nanowire junction, the first enable line controlling input-signal transmission in any of the signal wires to which the first enable line is interconnected by a field-effect transistor;
   a second enable line crossing each signal wire, the second enable line interconnected to each signal wire, the second enable line interconnected to a given signal wire by a field-effect-transistor nanowire junction when the first enable line is connected to the given signal wire by a high resistance nanowire junction, the second enable line interconnected to a given signal wire by a high resistance nanowire junction when the first enable line is connected to the given signal wire by a field-effect transistor;
   a first control line crossing each signal wire, the first control line interconnected to each signal wire by an asymmetric switch of a first type; and
   a second control line crossing each signal wire, the second control line interconnected to each signal wire by an asymmetric switch of a second type.

2. The nanowire-crossbar latch array of claim 1 wherein the nanowire junctions that interconnect the first enable line with each signal wire are field-effect transistors and the nanowire junctions that interconnect the second enable line with each signal wire are each one of:
   a field-effect transistor; and
   a high resistance nanowire junction.

3. A nanoscale circuit comprising:
   a nanoscale logic array; and
   a number of nanowire-crossbar latch arrays interconnected with the nanoscale logic array, each nanowire-crossbar latch array including
      a number of signal wires,
      a first enable line crossing each signal wire, the first enable line interconnected to each signal wire by a nanowire junction, the first enable line controlling input-signal transmission in any of the signal wires to which the first enable line is interconnected by a field-effect transistor nanowire junction,
      a second enable line crossing each signal wire, the second enable line interconnected to each signal wire by a nanowire junction,
      a first control line crossing each signal wire, the first control line interconnected to each signal wire by a signal-storing nanowire junction, and
      a second control line crossing each signal wire, the second control line interconnected to each signal wire by a signal-storing nanowire junction.

4. The nanoscale circuit of claim 3 wherein the nanowire junctions that interconnect the first enable line with each signal wire are field-effect transistors and the nanowire junctions that interconnect the second enable line with each signal wire are each one of:
   a field-effect transistor; and
   a high resistance nanowire junction.

5. A method for storing information in, and outputting stored information from, a nanoscale circuit, the method comprising:
   providing a nanowire-crossbar latch array having a number of signal wires that transmit input and output signals, a field-effect transistor or a high resistance nanowire junction at each nanowire junction interconnecting each signal wire and a first enable line, a field-effect transistor or a high resistance nanowire junction at each nanowire junction interconnecting each signal wire and a second enable line, a first type of asymmetric switch at each nanowire junction interconnecting each signal wire and a first control line, and a second type of asymmetric switch at each nanowire junction interconnecting each signal wire and a second control line;
   storing a signal by
      applying the signal as input to each signal wire,
      applying voltage $V_{enable}$ to the first enable line,
      applying an unconditional-open-voltage pulse to the first and second control lines, and
      applying a conditional-close voltage pulse to the first and second control lines; and
   outputting stored signals by
      applying voltage $V_{disable}$ to the first enable line, and
      applying a strong0 voltage to the first control line and a strong1 voltage to the second control line.

6. The method of claim 5 further comprising applying voltage $V_{disable}$ to the second enable line.

7. The method of claim 5 further comprising outputting inverted stored signals by:
- applying voltage $V_{disable}$ to the first enable line; and
- applying a strong1 voltage to the first control line and a strong0 voltage to the second control line.

8. The method of claim 7 wherein the nanowire-crossbar latch array further comprises a field-effect transistor or a high resistance nanowire junction interconnecting each signal wire and a second enable line.

9. The method of claim 8 further comprising applying voltage $V_{disable}$ to the second enable line.

10. A method for storing information in a nanoscale circuit, the method comprising:
- providing a nanowire-crossbar latch array having a number of signal wires that transmit input and output signals, a first control line interconnected to each signal wire by an asymmetric switch nanowire junction, a second control line interconnected to each signal wire by an asymmetric switch nanowire junction, a first enable line interconnected to each signal wire by one of, a field-effect transistor or a high resistance nanowire junction, and a second enable line interconnected to each signal wire by one of, a field-effect transistor or a high resistance nanowire junction, when the interconnection between a signal wire and one of the two enable lines is a field-effect transistor, the interconnection between the signal wire and the other of the two enable lines is a high resistance nanowire junction;
- applying an input signal to each signal wire;
- applying voltage $V_{enable}$ to the field-effect-transistor-interconnected enable line;
- applying an unconditional-open-voltage pulse to the first and second control lines; and
- applying a conditional-close voltage pulse to the first and second control lines.

11. The method of claim 10 further comprising outputting stored signals by:
- applying voltage $V_{disable}$ to the field-effect-transistor-interconnected enable line; and
- applying a strong0 voltage to the first control line and a strong1 voltage to the second control line.

12. The method of claim 10 further comprising outputting inverted stored signals by:
- applying voltage $V_{disable}$ to the field-effect-transistor-interconnected enable line; and
- applying a strong1 voltage to the first control line and a strong0 voltage to the second control line.

* * * * *